(12) United States Patent
Yang

(10) Patent No.: US 10,288,704 B2
(45) Date of Patent: May 14, 2019

(54) TWO-DIMENSIONAL SEMI-LASER CORRELATION SPECTROSCOPY WITH WELL-MAINTAINED CROSS PEAKS

(71) Applicant: THE BOARD OF TRUSTEES OF THE UNIVERSITY OF ILLINOIS, Urbana, IL (US)

(72) Inventor: Shaolin Yang, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 629 days.

(21) Appl. No.: 14/782,474

(22) PCT Filed: Apr. 4, 2014

(86) PCT No.: PCT/US2014/033028
§ 371 (c)(1),
(2) Date: Oct. 5, 2015

(87) PCT Pub. No.: WO2014/165793
PCT Pub. Date: Oct. 9, 2014

(65) Prior Publication Data
US 2016/0041243 A1 Feb. 11, 2016

Related U.S. Application Data
(60) Provisional application No. 61/808,361, filed on Apr. 4, 2013.

(51) Int. Cl.
*G01V 3/00* (2006.01)
*G01R 33/483* (2006.01)
(Continued)

(52) U.S. Cl.
CPC ..... *G01R 33/4833* (2013.01); *G01R 33/4633* (2013.01); *G01R 33/485* (2013.01)

(58) Field of Classification Search
CPC ............ G01R 33/4616; G01R 33/4833; G01R 33/485; G01R 33/385; G01R 33/4828;
(Continued)

(56) References Cited

U.S. PATENT DOCUMENTS

2006/0244447 A1* 11/2006 Michaeli ............ G01R 33/446
324/309
2012/0212223 A1* 8/2012 Nishihara ............ A61B 5/055
324/309
(Continued)

FOREIGN PATENT DOCUMENTS

WO    WO 2014121065 A1 * 8/2014    ......... G01R 33/4833

OTHER PUBLICATIONS

Govindaraju et al., "Proton NMR Chemical Shifts and Coupling Constants for Brain Metabolites," NMR in Biomedicine, NMR Biomed. 2000; 13:129-159.
(Continued)

*Primary Examiner* — Rodney E Fuller
(74) *Attorney, Agent, or Firm* — McDonnell Boehnen Hulbert & Berghoff LLP

(57) ABSTRACT

A sLASER-first-COSY sequence is disclosed. After a delay time, $\Delta_1$, from application of a first 90° radio frequency (RF) pulse, a first pair of adiabatic full-passage (AFP) pulses are applied to an object in a MRI scanner. The first 90° RF pulse is a non-adiabatic slice-selective 90° RF pulse and the first pair of AFP pulses is separated by an inter-pulse time interval, $\Delta_2$. A second pair of AFP pulses, separated by the time $\Delta_2$, is then applied, followed by a second 90° RF pulse. The second 90° RF pulse is a non-adiabatic non-slice-selective 90° RF pulse. MR signal is acquired after an echo time (TE) from application of the excitation RF pulse. The present method may achieve intended full magnetization transfer between a coupled spin pair of a metabolite and
(Continued)

maintain metabolite cross peak intensity of a coupled spin pair of a metabolite in the object.

19 Claims, 12 Drawing Sheets

(51) Int. Cl.
  *G01R 33/46* (2006.01)
  *G01R 33/485* (2006.01)
(58) Field of Classification Search
  CPC .... G01R 33/4831; G01R 33/50; G01R 33/54; G01R 33/656
  USPC ......................................................... 324/309
  See application file for complete search history.

(56) References Cited

U.S. PATENT DOCUMENTS

| | | | | |
|---|---|---|---|---|
| 2013/0141096 A1* | 6/2013 | Bottomley | ............. | G01R 33/50 324/309 |
| 2015/0241532 A1* | 8/2015 | Neji | ..................... | G01R 33/385 324/309 |
| 2015/0369892 A1* | 12/2015 | Yang | .................. | G01R 33/4833 324/309 |
| 2017/0160361 A1* | 6/2017 | Feldman | ............ | G01R 33/4833 |

OTHER PUBLICATIONS

De Graaf et al., "A New Localization Method Using an Adiabatic Pulse, BIR-4," Journal of Magnetic Resonace, Series B 106, 245-253 (1995).
De Graaf et al., "Spectral Editing with Adiabatic Pulses," Journal of Magnetic Resonance, Series B 109, 184-193 (1995).
De Graaf et al., "B1-Insensitive, Single-Shot Localization and Water Suppression," Journal of Magnetic Resonance, Series B 113, 35-45 (1996), Article No. 0152.
De Graaf et al., "Adiabatic Water Suppression Using Frequency Selective Excitation," 1998, 690-696.
De Graaf et al., "In Vivo Detection and Quantification of Scalar Coupled 1H NMR Resonances," In Vivo NMR of Coupled Spins, 2001, 32-76.
Mason et al., "Numerically Optimized Experiment Design for Measurement of Grey/White Matter Metabolite T2 in High-Resolution Spectroscopic Images of Brain," Journal of Magnetic Resonance, Series B 107, 68-73 (1995).
Mehlkopf et al., "Sources of t1 Noise in Two-Dimensional NMR," Journal of Magnetic Resonance 58, 315-323 (1984).
Norris et al., Adiabatic Rediofrequency Pulse Forms in Biomedical Nuclear Magnetic Resonance, Norris, 2002, 89-101.
Ryner et al., "3D Localized 2D NMR Spectroscopy on an MRI Scanner," Journal of Magnetic resonance, Series B 107, 126-137 (1995).
Tannus et al., "Adiabatic Pulses," NMR in Biomedicine, vol. 10, 423-434 (1997).
Yablonsky et al., "Homonuclear J Coupling Effects in Volume Localized NMR Spectroscopy: Pitfalls and Solutions," Communications, p. 169-178.
Andronesi et al., "Low-Power Adiabatic Sequences for In Vivo Localized Two-Dimensional Chemical Shift Correlated MR Spectroscopy," Magnetic Resonance in Medicine, 2010, pp. 1542-1556, vol. 64.
Andronesi et al., "Detection of 2-Hydroxyglutarate in IDH-Mutated Glioma Patients by In Vivo Spectral-Editing and 2D Correlation Magnetic Resonance Spectroscopy," Science Translational Medicine, 2012, pp. 1-16, vol. 4, Issue 16.
Andronesi et al., "Spectroscopic imaging with improved gradient modulated constant adiabaticity pulses on high-field clinical scanners," Journal of Magnetic Resonance, 2010, pp. 283-293, vol. 203.
Balchandani et al., "Slice-Selective Tunable-Flip Adiabatic Low Peak-Power Excitation Pulse," Magnetic Resonance in Medicine, 2008, pp. 1072-1078, vol. 59.
Boer et al., "7-T 1H MRS with adiabatic refocusing at short TE using radio frequency focusing with a dual-channel volume transmit cell," NMR in Biomedicine, 2011, pp. 1038-1046, vol. 24, No. 9.
Edden et al., "If J Doesn't Evolve, It Won't J-Resolve: J-Press With Bandwidth-Limited Refocusing Pulses," Magnetic Resonance in Medicine, 2011, pp. 1509-1514, vol. 65.
Garwood et al., "The Return of the Frequency Sweep: Designing Adiabatic Pulses for Contemporary NMR," Journal of Magnetic Resonance, 2001, pp. 155-177, vol. 153.
International Searching Authority, International Search Report for International Application No. PCT/US2014/033028, dated Jul. 21, 2014, 14 pages.
Kinchesh et al., "Spin-echo MRS in humans at high field: LASER localisation using FOCI pulses," Journal of Magnetci Resonance, 2005, pp. 30-43, vol. 175.
Lin et al., "Two-dimensional J-resolved LASER and Semi-LASER Spectroscopy of Human Brain," Magnetic Resonance in Medicine, 2014, pp. 911-920, vol. 71.
Lin et al., "Two-Dimensional Semi-LASER Correlation Spectroscopy with Well-Maintained Cross Peaks," Magnetic Resonance in Medicine, 2014, pp. 26-32, vol. 72.
Michaeli et al., "Proton T2 Relaxation Study of Water, N-acetylaspartate, and Creatine in Human Brain Using Hahn and Carr-Purcell Spin Echoes at 4T and 7T," Magnetic Resonance in Medicine, 2002, pp. 629-633, vol. 47.
Moore et al., "Evaluation of non-selective refocusing pulses for 7 T MRI," Journal of Magnetic Resonance, 2012, pp. 212-220, vol. 214.
Ramadan et al., "Adiabatic Localized Correlation Spectroscopy (AL-COSY): Application in Muscle and Brain," Journal of Magnetic Resonance Imaging, 2011, pp. 1447-1455, vol. 33.
Ryner et al., "Localized 2D J-resolved 1H MR Spectroscopy: Strong Coupling Effects in-vitro and in-vivo," Magnetic Resonance Imaging, 1995, pp. 853-869, vol. 13, No. 6.
Sacolick et al., "Adiabatic Refocusing Pulses for Volume Selection in Magnetic Resonance Spectroscopic Imaging," Magnetic Resonance in Medicine, 2007, pp. 548-553, vol. 57.
Scheenen et al., "Towards 1H-MRSI of the human brain at 7T with slice-selective adiabatic refocusing pulses," Magn Reson Mat Phys, 2008, pp. 95-101, vol. 21.
Scheenen et al., "Short Echo Time 1H-MRSI of the Human Brain at 3T With Minimal Chemical Shift Displacement Errors Using Adiabatic Refocusing Pulses," Magnetic Resonance in Medicine, 2008, pp. 1-6, vol. 59.
Schirmer et al, "On the reliability of quantitative clinical magnetic resonance spectroscopy of the human brain," NMR in Biomedicine, 2000, pp. 28-36, vol. 13.
Schulte et al, "ProFit: two-dimensional prior-knowledge fitting of J-resolved spectra," NMR in Biomedicine, 2006, pp. 255-263, vol. 19.
Thomas et al., "Evaluation of two-dimensional L-COSY and JPRESS using a 3 T MRI scanner: from phantoms to human brain in vivo," NMR in Biomedicine, 2003, pp. 245-251, vol. 16.
Thomas et al., "Localized two-dimensional shift correlated MR spectroscopy of human brain," Magnetic Resonance in Medicine, 2001, pp. 58-67, vol. 46.
Thompson et al., "Sources of Variability in the Response of Coupled Spins to the PRESS Sequence and Their Potential Impact on Metabolite Quantification,"Magnetic Resonance in Medicine, 1999, pp. 1162-1169, vol. 41.

* cited by examiner

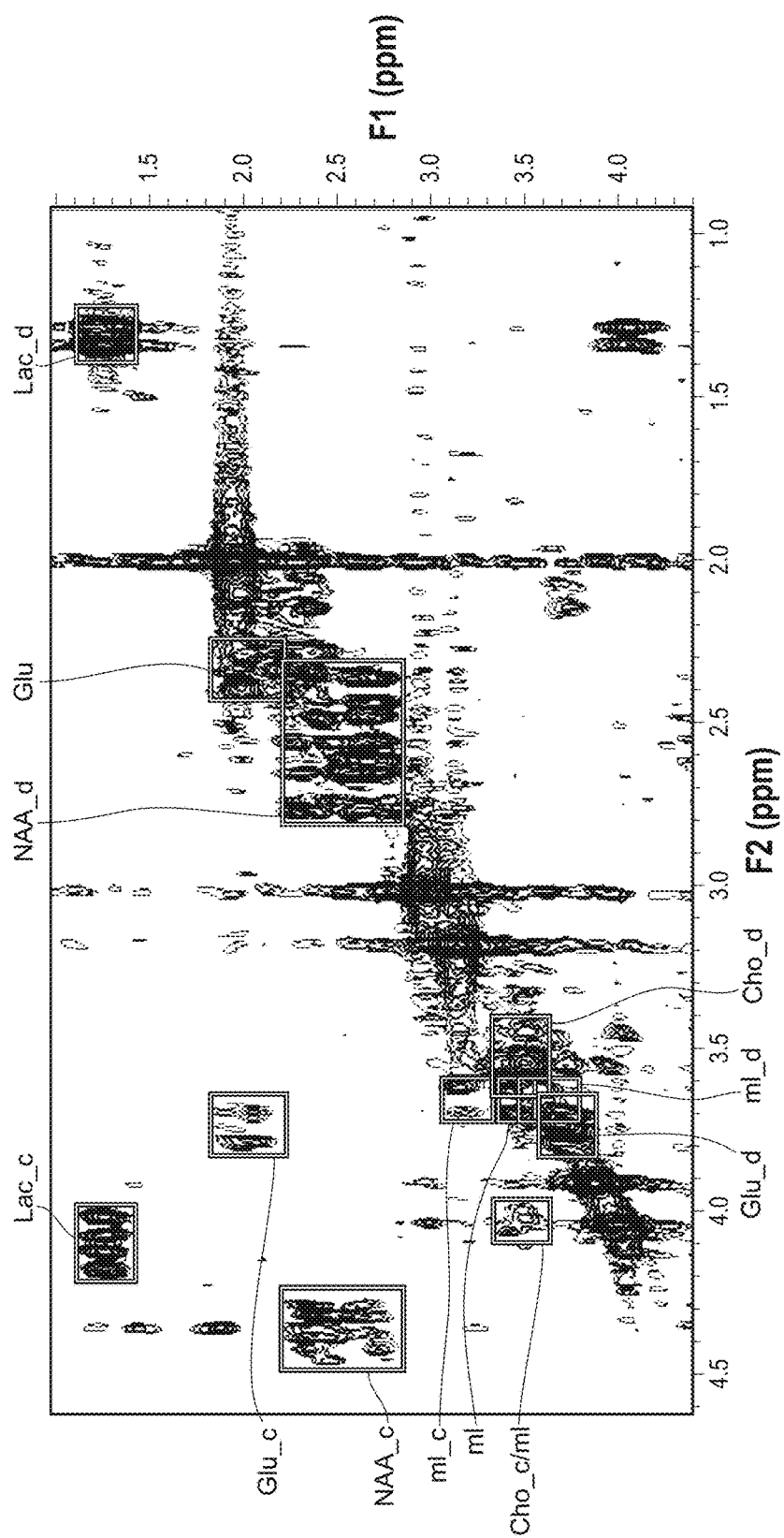

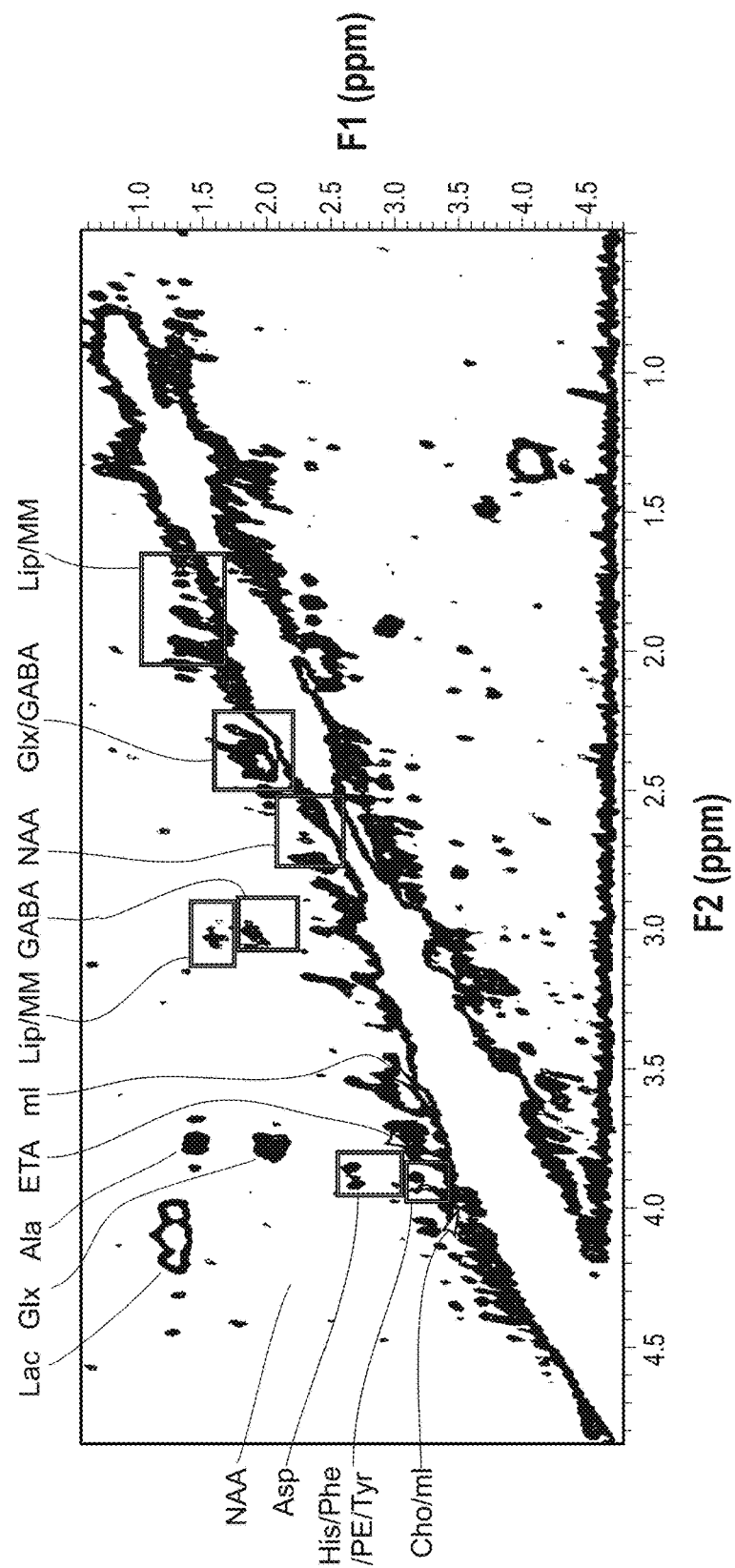

TWO-DIMENSIONAL SEMI-LASER CORRELATION SPECTROSCOPY WITH WELL-MAINTAINED CROSS PEAKS

CROSS-REFERENCE TO RELATED APPLICATIONS

This Application is a U.S. National Phase of International Application No. PCT/US2014/033028, filed Apr. 4, 2014, which claims the benefit of priority to U.S. Provisional Application 61/808,361 filed Apr. 4, 2013, the disclosures of which are hereby incorporated by reference in their entireties.

GOVERNMENT RIGHTS

This invention was made with government support under Grant Nos. R01 MH063764 and R01 MH073989 awarded by the National Institutes of Health (NIH). The government has certain rights in the invention.

BACKGROUND

Magnetic Resonance Spectroscopy (MRS) is an analytical method that can be used to identify and quantify certain metabolites in samples or areas of interest in the body. While relying on similar principles and using similar equipment, MRS differs from conventional Magnetic Resonance Imaging (MRI) in that the obtained spectra provide physiological and biochemical information about the sample, instead of anatomy and positional information used to form an image. By exploiting the magnetic properties of certain nuclei, MRS can provide detailed information about the structure, dynamics, reaction state, and chemical environment of the molecules in which they are contained. Similar to MRI, MRS is typically performed by placing the subject or object at or near the isocenter of a strong, uniform magnetic field, $B_0$, known as the main magnetic field. The main magnetic field causes the nuclei (spins) in the matter comprising the subject or object to possess a magnetic moment. The spins form a magnetization that precesses around the magnetic field direction at a rate proportional to the magnetic field strength.

If the magnetization is perturbed by a small radio-frequency (RF) magnetic field, known as $B_1$ magnetic field, the spins may emit RF radiation at a characteristic frequency. By applying the $B_1$ magnetic field as one or more timed pulses and/or sequences of pulses with delay periods between them, the emitted RF radiation can be detected and analyzed to identify and quantify chemical compounds within an object and infer information about metabolic activity. Various techniques utilizing specific sequences of RF pulses with specific timing, frequencies, and intensities have been developed, providing new advances, as well as introducing new challenges.

MRS experiments can gather data in one-dimensional (1D MRS) or two-dimensional frequency or spectral space (2D MRS). Spectra obtained in 1D MRS relate to the chemical shift properties of the nuclei in the sample. More than 20 metabolites have been reported in the $^1$H-MRS spectra of the human brain (26, 27). 1D $^1$H-MRS on clinical MR scanners is hampered primarily by the difficulty in resolving dozens of peaks over a small spectral range of about 4 ppm. One solution is 2D MRS (28, 29), which increases the detectability of overlapping metabolites by spreading the spectrum into a second dimension. 2D MRS provides information on the structure of molecules and helps reliable assignment, quantification, and identification of metabolites (1). 2D localized chemical shift correlated spectroscopy (L-COSY) (10, 30-31) and 2D J-resolved spectroscopy (J-PRESS) (31, 32) are the most popular 2D MRS methods, though there are many derivations. 2D J-resolved spectroscopy can be used to analyze molecules for which their 1D MRS spectra contain overlapping resonance peaks (multiplets) due to J-coupling. J-coupling arises from the interaction of different spin states through the chemical bonds of a molecule and can provide insight into the connectivity of nuclei in a molecule. The 2D J-resolved spectrum vertically displaces the multiplet from each nucleus by a different amount. Each peak in the 2D J-resolved spectrum will have the same horizontal coordinate that it has in a non-decoupled 1D spectrum, but its vertical coordinate will be the J-coupling constants of the single peak that the nucleus has in a decoupled 1D spectrum.

Compared to J-resolved spectroscopy, COSY allows determination of the connectivity of a molecule by examining which spins are coupled. In turn, COSY yields better dispersion and more separation of J-cross peaks, allowing for better spectral quantification, despite requiring a larger spectral window to sample during the evolution period. Therefore maintaining the intensity of cross peaks is important for accurate and reliable quantification of COSY spectra.

MRS may benefit more from higher main magnetic field strengths than conventional MRI. The high-field magnets improve the sensitivity and specificity of the obtained spectral information by providing higher signal-to-noise ratio (SNR) and increased chemical shift dispersion (2, 3). The improved SNR also allows for shorter acquisition times or smaller detection volumes (1-3). The increased chemical shift dispersion improves the resolution of spectral information (1, 2). Despite these benefits, higher field strengths can cause shorter apparent transverse relaxation time ($T_2^*$) (4-6), longer longitudinal relaxation time ($T_1$) (5), increased main static field ($B_0$) and RF field ($B_1$) inhomogeneity, and increased chemical shift displacement error (CSDE) (3). Further, the separation (or dispersion) of resonance peaks in MRS spectra is magnetic field dependent and the increased chemical shift dispersion sets higher demand on the bandwidth (BW) of RF pulses that are used for the localization for MRS. CSDE is proportional to the main static magnetic field ($B_0$) and reversely proportional to the BW of slice-selective RF pulses (2, 7-9). In addition, the available RF power is usually more limited relative to the increased field strengths (2).

In 2D J-resolved spectroscopy, the limited BWs of RF pulses not only cause CSDEs but also lead to spatially dependent evolution of J-coupling (11), which results in additional J-refocused artifactual peaks (11-14). In J-PRESS; for a pair of coupled spins with a large chemical shift difference; one of the coupled spin pair may not undergo the 180° refocusing pulses due to the finite BW of the RF pulses in the voxel selected for its J-coupled partner. Therefore part of J-coupling will be refocused instead of evolving during the echo time (TE), which leads to additional so-called "J-refocused peaks" and at the same time attenuates the intensities of intended J-resolved peaks in a J-PRESS spectrum.

Unfortunately, a similar issue exists in L-COSY The basic COSY sequence is composed of two 90° RF pulses. The second 90° pulse mixes the spin states and transfers magnetization between coupled spins, which results in cross-peaks. In conventional 2D L-COSY, the sequence also includes one slice-selective 180° RF pulse (10), which will contribute to a larger CSDE than a slice-selective 90° RF pulse. The limited BW of the RF pulses for slice selection not only causes CSDE, but also leads to spatially dependent evolution of J-coupling (11), which results in additional J-refocused artifactual peaks in 2D J-resolved spectroscopy (11-14). Similarly in L-COSY, when the BWs of RF pulses are limited, one of the coupled spin pair may not undergo the second 90° pulse in the voxel selected for its J-coupled partner. As a result, magnetization transfer between coupled spins will not occur in part of the voxel, which leads to spatially dependent magnetization transfer and results in reduced cross peak intensity in L-COSY.

Accordingly, application of a second 90° RF pulse with limited BW will result in attenuated cross-peaks in L-COSY spectra. As cross peaks contain important information of the metabolites with coupled spin systems, compromised cross peaks will impair the quantification of L-COSY spectra. However, as will be described in full herein, this effect can be significantly suppressed when the second 90° RF pulse is not slice-selective, which can be better achieved by using an alternative semi-localization by adiabatic selective refocusing (semi-LASER) method for volume localization.

Adiabatic RF pulses, which have been applied for localization in MRS, can be used to address some of the issues related to CSDE (3, 7, 15-18, 33-38). Adiabatic pulses offer large BWs and produce a uniform flip angle despite variation in $B_1$, provided that the $B_1$ field strength is above a certain threshold. However, in contrast to conventional RF pulses, which can rotate magnetization around an axis in the rotating frame, a single adiabatic pulse cannot generate plane rotation (9, 16). If a pair of adiabatic refocusing pulses are used, the second adiabatic refocusing pulse can compensate or cancel the phase dispersion generated by the first adiabatic refocusing pulse. Therefore, a pair of adiabatic refocusing pulses is usually applied to define a slice. A single-shot spin-echo based sequence called LASER, which stands for "localization by adiabatic selective refocusing," has been used for 1D MRS (16). LASER uses a non-slice-selective excitation pulse followed by three pairs of adiabatic full-passage (AFP) pulses for signal refocusing as well as selection of three orthogonal planes in space.

Recently, adiabatic localization was incorporated into basic COSY sequences. In one example, called "LASER-COSY," which uses a non-slice-selective excitation pulse followed by three pairs of AFP pulses, was used for signal refocusing as well as volume selection (1, 18, 19). In another example sequence, called "sLASER-last-COSY," which uses two pairs of AFP pulses and the second 90° RF pulse for volume localization (8). However, as will be discussed herein, the limited bandwidth of the slice-selective second 90° RF pulse used in sLASER-last-COSY induces spatially dependent magnetization transfer that results in attenuated cross-peaks and lower ratios of cross peak volumes to diagonal peak volumes. Further, LASER-COSY has a few disadvantages including significantly longer TE and higher specific absorption rate (SAR). Therefore, a need remains in the art for an improved 2D MRS technique that facilitates more reliable and accurate quantification of metabolites with coupled spin systems at 3 T and higher field strengths.

OVERVIEW

A new 2D semi-LASER localized COSY sequence, called "sLASER-first-COSY," that incorporates a semi-localization by adiabatic selective refocusing (sLASER) method into the COSY sequence with a slice-selective first 90° RF pulse and a non-slice-selective second 90° RF pulse, is described herein. This sequence employs the first 90° RF pulse and two pairs of AFP pulses for volume localization and the non-slice-selective second 90° RF pulse for magnetization transfer to solve the problem of spatially dependent magnetization transfer as observed in L-COSY. Embodiments disclosed herein provide novel systems and methods implementing the sLASER-first-COSY technique.

Both the sLASER-first-COSY and sLASER-last-COSY sequences utilize two pairs of AFP pulses for slice selections in two orthogonal planes. In the sLASER-first-COSY sequence, however, the excitation pulse (i.e., the first 90° pulse) is used for selection of the third orthogonal plane while the second 90° pulse is only used as the mixing pulse for COSY, but not for slice selection. In sLASER-last-COSY sequence (8), the mixing pulse (i.e., the second 90° pulse) is used for selection of the third orthogonal plane. In both sequences, crusher gradients and 8-step phase cycling are applied for suppressing unwanted free induction decays (FIDs).

Compared to L-COSY and sLASER-last-COSY, the novel sLASER-first-COSY sequence prevents the attenuation of cross peaks due to spatially dependent magnetization transfer when the second 90° RF pulse (i.e., the mixing pulse), having a limited bandwidth, is used for slice selection. The results of experiments on phantoms and human and pig brains set forth herein demonstrate that sLASER-first-COSY yields well-maintained cross-peaks compared with sLASER-last-COSY. Further, as COSY relies on the cross peaks to obtain larger dispersion of peaks for quantification, the well-maintained cross peaks yielded by sLASER-first-COSY will facilitate more reliable and accurate quantification of metabolites with coupled spin systems than sLASER-last-COSY.

Hence, in one respect, various embodiments of the present invention provide, in a magnetic resonance imaging (MRI) scanner system, a computer-implemented method comprising: (1) applying to an object in the MRI scanner system a first 90° radiofrequency (RF) pulse, wherein the first 90° RF pulse is a non-adiabatic slice-selective 90° RF pulse; (2) after a delay time, $\Delta_1$, from application of the first 90° RF pulse, applying to the object, a first pair of adiabatic full-passage (AFP) pulses, wherein the first pair of AFP pulses is separated by an inter-pulse time interval, $\Delta_2$; (3) applying to the object, a second pair of AFP pulses, wherein the second pair of AFP pulses is separated by the time $\Delta_2$; (4) applying to the object a second 90° RF pulse, wherein the second 90° RF pulse is a non-adiabatic non-slice-selective 90° RF pulse; and (5) acquiring MR signal after an echo time (TE) from application of the excitation RF pulse.

In still another respect, various embodiments of the present invention provide an MRI scanner system comprising: (1) one or more processors; (2) a memory; (3) a main magnet; (4) a plurality of gradient coils positioned in the main magnet; (5) an RF transceiver system; (6) an RF coil assembly; (7) a pulse module for transmitting signals to the RF coil assembly; (8) an RF switch controlled by the pulse module; and (9) machine-readable instructions stored in the memory that, when executed by the one or more processors, cause the MRI scanner system to carry out functions including: (i) applying to an object in the MRI scanner system a first 90° radiofrequency (RF) pulse, wherein the first 90° RF pulse is a non-adiabatic slice-selective 90° RF pulse; (ii) after a delay time, $\Delta_1$, from application of the first 90° RF pulse, applying to the object, a first pair of adiabatic full-passage (AFP) pulses, wherein the first pair of AFP pulses are separated by an inter-pulse time interval, $\Delta_2$; (iii) applying to the object, a second pair of AFP pulses, wherein the second pair of AFP pulses are separated by the time $\Delta_2$; (iv) applying to the object a second 90° RF pulse, wherein the second 90° RF pulse is a non-adiabatic non-slice-selective 90° RF pulse; and (v) acquiring MR signal after an echo time (TE) from application of the excitation RF pulse.

In still another respect, various embodiments of the present invention provide a nontransitory computer-readable medium having instructions stored thereon that, upon execution by one or more processors of an MRI system, cause the MRI system to carry out functions comprising: (1) applying to an object in the MRI scanner system a first 90° radiofrequency (RF) pulse, wherein the first 90° RF pulse is a non-adiabatic slice-selective 90° RF pulse; (2) after a delay time, $\Delta_1$, from application of the first 90° RF pulse, applying to the object, a first pair of adiabatic full-passage (AFP) pulses, wherein the first pair of AFP pulses are separated by an inter-pulse time interval, $\Delta_2$; (3) applying to the object, a second pair of AFP pulses, wherein the second pair of AFP pulses are separated by the time $\Delta_2$; (4) applying to the object a second 90° RF pulse, wherein the second 90° RF pulse is a non-adiabatic non-slice-selective 90° RF pulse; and (5) acquiring MR signal after an echo time (TE) from application of the excitation RF pulse.

These as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate the invention by way of example only and, as such, that numerous variations are possible.

BRIEF DESCRIPTION OF THE DRAWINGS

FIGS. 5A, 5B and 5C illustrate spectra acquired from the GE MRS Braino phantom, fresh pig brain tissue and human brain, respectively, generated by one example of an L-COSY pulse sequence.

DETAILED DESCRIPTION

Figure 1A:
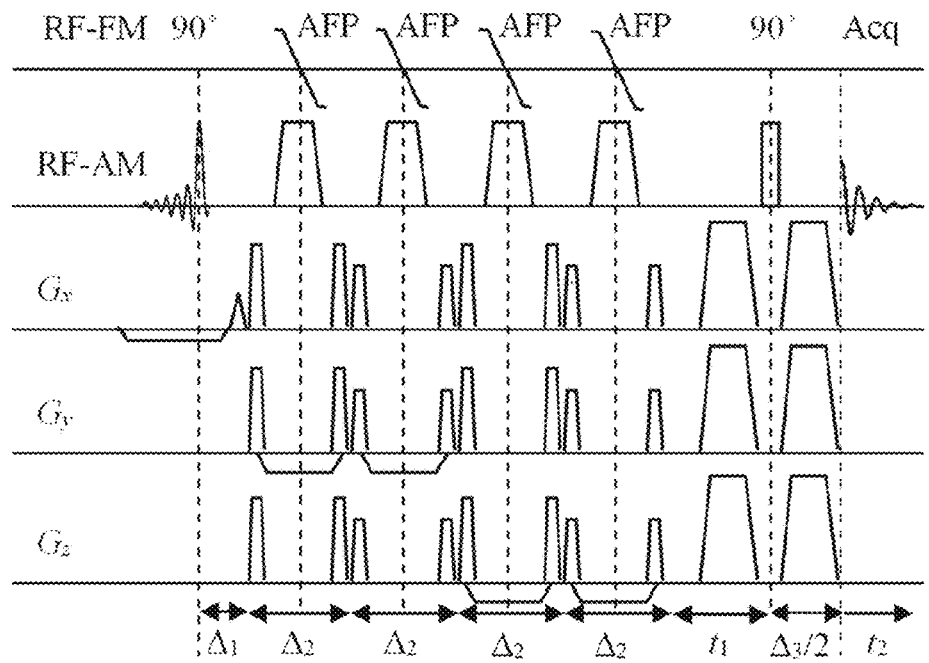
FIG. 1A illustrates an example embodiment of a sLASER-first-COSY pulse sequence.

The embodiments disclosed herein by way of example provide example MRS techniques applicable in an MRI system. An MRI system typically comprises hardware components including a plurality of gradient coils positioned about a bore of a magnet, an RF transceiver system, and an RF switch controlled by a pulse module to transmit RF signals to and receive RF signals from an RF coil assembly. The received RF signals are also known as magnetic resonance (MR) signal data. An MRI system also includes a computer programmed to cause the system to apply to an object in the system various RF signals, magnetic fields, and field gradients for inducing spin excitations and slice selection in an object, to acquire MR signal data from the object, to process the MR signal data, and to construct an MR image of the object from the processed MR signal data. The computer can include one or more general or special purpose processors, one or more forms of memory, and one or more hardware and/or software interfaces for interacting with and/or controlling other hardware components of the MRI system.

MRS relies, at least in part, on the principle that some nuclei possess a magnetic moment (nuclear spin), which gives rise to different energy levels and resonance frequencies in a magnetic field. These MRS active nuclei absorb electromagnetic radiation at a frequency (f) characteristic of the isotope, as given by the Larmor equation: $f=\gamma B_0$, where the gyromagnetic ratio ($\gamma$) is a constant for each nuclear species. Different nuclei resonate at a different frequency at this field strength in proportion to their nuclear magnetic moments. For example, hydrogen nuclei (which are the most common nuclei employed in MRS due to their abundance in human tissues), precess at approximately 64 MHz in a magnetic field of 1.5 Tesla. Many nuclei can be used to obtain MR spectra, including hydrogen ($^1$H), phosphorus ($^{31}$P), fluorine ($^{19}$F), carbon ($^{13}$C) and sodium ($^{23}$Na).

The resonant signals of the nuclei in a sample can also depend on their different electronic environments. The electric shell interactions of these nuclei with the surrounding molecules cause a change in the local magnetic field leading to a change on the spin frequency of the nuclei—a phenomenon called chemical shift. The size of the chemical shift is given with respect to a reference frequency or reference sample, usually a molecule with a barely distorted electron distribution, such as tetramethylsilane. Because it is independent of the field strength, the chemical shift position of a nucleus is typically expressed in parts-per-million (ppm) (choline, for example, will be positioned at 3.2 ppm). The chemical shift provides information about the structure of the molecule and is obtained with 1D MRS. The 1D MR spectrum can be graphically represented by the x axis that corresponds to the metabolite frequency in ppm according to the chemical shift and the y axis that corresponds to the peak amplitude.

Some metabolites, such as lactate, have doublets, triplets or multiplets instead of single peaks on the chemical shift spectrum. These peaks can be explained by J-coupling, a phenomenon that occurs when the molecular structure of a metabolite is such that protons are found in different atomic groups (for example $CH_3$— and $CH_2$—). Due to variations in local geometry (binding partners, bond lengths, angles between bonds, etc.), these groups each have a slightly different local magnetic fields and each $^1$H therefore resonates at a frequency characteristic of its position in the molecule resulting in a multiplet peak. Where the chemical shift relates to a nucleus's environment and relative position in the molecule, the J-coupling contains information about bond distance and angles and the interaction between nuclei.

In cases where the 1D MR spectrum of a molecule contains overlapping multiplets, a second dimension of data can be necessary to fully understand the chemical makeup and structure of the molecules in a sample. 2D J-resolved spectroscopy, one form of 2D MRS, can be used to acquire J-coupling data by vertically displacing the multiplet from each nuclei by a different amount. The two dimensions of a two-dimensional MRS experiment are two frequency axes representing chemical shift and J-coupling information.

Each frequency axis is associated with one of two time variables—the length of the evolution period, $t_1$, and the time elapsed during the detection period—and are each converted from a time series to a frequency series through a two-dimensional Fourier transform. Each peak in the 2D spectrum has the same horizontal coordinate that it has in a non-decoupled 1D spectrum, but its vertical coordinate is the chemical shift of the single peak that the nucleus has in a decoupled 1D spectrum. A single two-dimensional experiment is generated as a series of one-dimensional experiments, with a different specific evolution time in successive experiments, with the entire duration of the detection period recorded in each experiment.

As described above, specific pulse sequences have been developed to obtain 1D MRS and 2D MRS data. However, due to the limited bandwidth of the second 90° radiofrequency (RF) pulse used in L-COSY, this sequence induces spatially dependent magnetization transfer that results in attenuated cross-peaks. This result is disadvantageous, as COSY relies on the cross peaks to obtain larger dispersion of peaks for quantification. The present disclosure describes modifying the basic localized COSY technique to incorporate the advantages of the semi-LASER pulse sequence. Further, the disclosed techniques provide several advantages over the known L-COSY and sLASER-last-COSY pulse sequences. The feasibility and advantages of the sLASER-first-COSY sequence described herein were verified by phantom, pig brain and in vivo human brain studies.

As will be fully described herein, cross-peak attenuation due to spatially-dependent magnetization transfer can be mitigated by using an adiabatically localized COSY sequence with an alternative semi-LASER scheme. Specifically, a localized COSY scheme employing a first 90° RF pulse and two pairs of AFP pulses for volume localization and a non-slice-selective second 90° RF pulse for magnetization transfer is proposed.

1. sLASER-First-COSY and sLASER-Last-COSY Principles and Example Embodiment

Figure 1B:
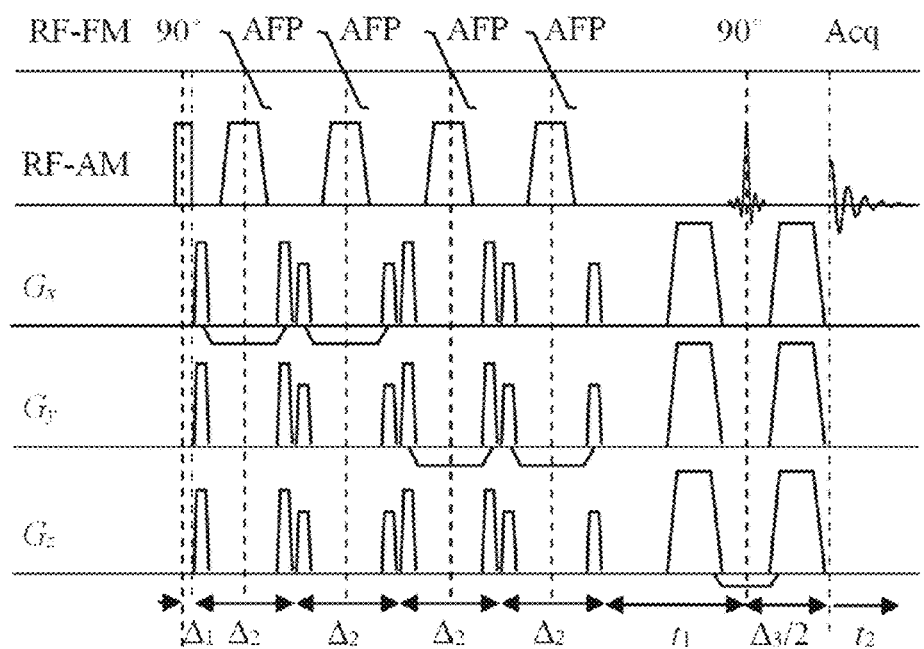
FIG. 1B illustrates an example embodiment of a sLASER-last-COSY pulse sequence.

The diagrams of sLASER-first-COSY and sLASER-last-COSY sequences are shown in FIGS. 1A and 1B, respectively. Both sequences contain two pairs of AFP pulses for slice selections in two orthogonal planes. In the sLASER-first-COSY sequence (FIG. 1A), the excitation pulse (i.e., the first 90° pulse) is used for selection of the third orthogonal plane, while the second 90° pulse is only used as the mixing pulse for COSY, but not for slice selection. In the sLASER-last-COSY sequence (FIG. 1B), on the other hand, the mixing pulse (i.e., the second 90° pulse) is used for selection of the third orthogonal plane. In both sequences, crusher gradients and 8-step phase cycling are applied for suppressing unwanted free induction decays (FIDs). If motion is negligible during the scan, the application of more steps of phase cycling will reduce contamination from unwanted coherence transfer pathways. The phases of the first 90° pulse, four AFP pulses, the second 90° pulse, and the receiver for the 8-step phase cycling are (x, y, −x, −y, x, y, −x, −y), (x, x, x, x, −x, −x, −x, −x), (x, −x, x, −x, x, −x, x, −x), and (x, −y, −x, y, x, −y, −x, y), respectively. The total scan duration is less than 14 minutes. RF-AM shows the amplitude modulation profiles of the pulses, RF-FM the frequency modulation profiles. $\Delta_1$ is the interval between the excitation RF pulse and the beginning of the first AFP spoiler gradient. $\Delta_2$ is the interval between a pair of AFP spoiler gradients, including the AFP pulse. $\Delta_3$ is the interval between the last pair of spoiler gradients, including the second 90° RF pulse.

In both sequences the spoiler gradients around the second 90° RF pulses have an area of 44 mT/m·ms. However, the spoiler gradients for AFP pulses can be relatively small, because the profile of a pair of AFP pulses is quite sharp, and the residual refocusing outside the pass band is negligible (16, 21). A series of gradient-time integral values of spoiler gradients were tested to find the optimal design for suppressing artifacts in the in vivo experiments. For each pair of AFP pulses, the spoiler gradients were 10 mT/m with a duration of 0.31 ms (155 µs ramp-up/down times without top) around the first AFP pulse and 8 mT/m and 0.31 ms (155 µs ramp-up/down times without top) around the second AFP pulse in the phantom and ex vivo experiments, and the duration of spoiler gradients was 1.81 ms with 1.5 ms of top in the in vivo experiments.

Figure 2:
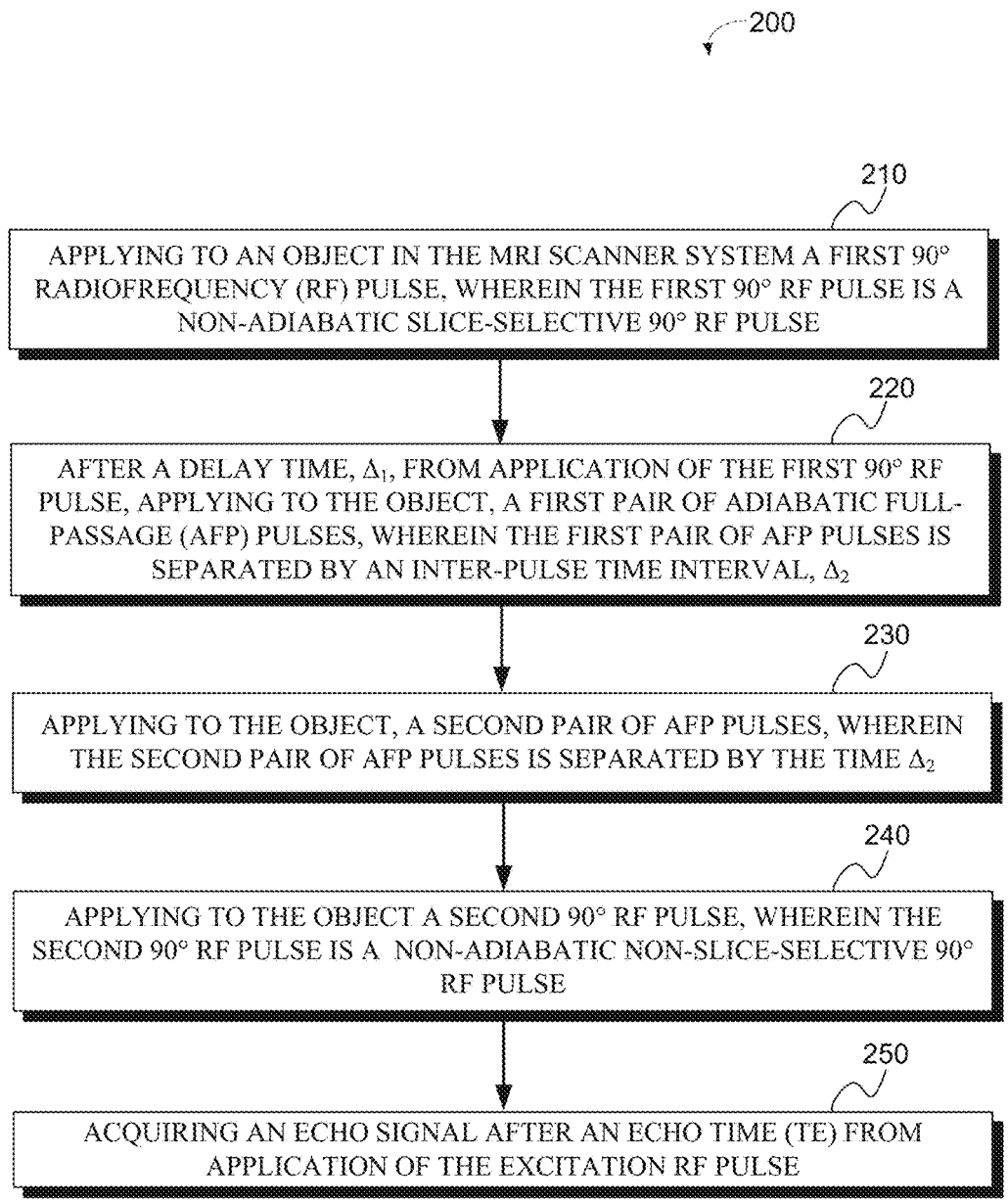
FIG. 2 illustrates an example embodiment of a method for implementing a sLASER-first-COSY pulse sequence.

An example embodiment of sLASER-first-COSY method 200 is illustrated in FIG. 2. By way of non-limiting example, the example method can be a computer-implemented method in an MRI system such as the one described above.

As illustrated in FIG. 2, at step 210, a first 90° radiofrequency (RF) pulse is applied to an object in the MRI scanner system. For the sLASER-first-COSY method, the first 90° RF pulse is a non-adiabatic slice-selective 90° RF pulse. After a delay time, $\Delta_1$, from application of the first 90° RF pulse, a first pair of adiabatic full-passage (AFP) pulses is applied to the object 220. The first pair of AFP pulses is separated by an inter-pulse time interval, $\Delta_2$. At step 230, a second pair of AFP pulses is applied to the object. The second pair of AFP pulses is separated by the time $\Delta_2$. The second pair of AFP pulses can be applied to the object after a time $2\Delta_2$ from application of the first pair of AFP pulses. Each of the AFP pulses, in both the first and second pairs, can be slice-selective. A second 90° RF pulse is then applied to the object 240. For the sLASER-first-COSY method, the second 90° RF pulse is a non-adiabatic non-slice-selective 90° RF pulse. The second 90° RF pulse can be applied to the object after a time $t_1+2\Delta_2$ from application of the second pair of AFP pulses. A magnetic resonance (MR) signal is acquired after an echo time (TE) from application of the excitation RF pulse 250. A sequence of integer N MR signal series can be obtained. For each of the N different TE periods, $t_1$ is increased by $\Delta t_1$.

Application of the first and second pairs of AFP pulses causes suppression of one or more of chemical shift artifacts and sensitivity to RF field inhomogeneity. Further, application of the second 90° RF pulse achieves magnetization transfer between a coupled spin pair of a metabolite in the object and maintains metabolite cross peak intensity of a coupled spin pair of a metabolite in the object.

A pair of magnetic field spoiler gradients ($G_x$) along a first direction, a pair of magnetic field spoiler gradients ($G_y$) along a second direction, and a pair of magnetic field spoiler gradients ($G_z$) along a third direction can be simultaneously applied to the object, around each AFP pulse. A first of the pair of magnetic field spoiler gradients ($G_x$) along a first direction, a first of the pair of magnetic field spoiler gradients ($G_y$) along a second direction, and a first of the pair of magnetic field spoiler gradients ($G_z$) along a third direction are each applied after an excitation delay time, $\Delta_1$, from application of the excitation RF pulse. The pairs of magnetic field spoiler gradients around each AFP pulse along the first direction ($G_x$), second direction ($G_y$) and third direction ($G_z$) each have a time interval of $\Delta_2$. Further, a pair of magnetic field spoiler gradients ($G_x$) along a first direction, a pair of magnetic field spoiler gradients ($G_y$) along a second direction, and a pair of magnetic field spoiler gradients ($G_z$) along a third direction can be simultaneously applied around the second 90° RF pulse. Each pair of gradients around the second 90° RF pulse has a time interval of $\Delta_3$. The length of TE corresponds to the time from application of the excitation RF pulse to $\Delta_3/2$ from application of the second 90° RF pulse.

It will be appreciated that sLASER-first-COSY can also be embodied as a non-transitory computer-readable medium, such as magnetic disk, CD-ROM, or the like, having non-transitory computer-readable medium having stored thereon computer-executable instructions that, if executed a processor or processors of the MRI system, cause the MRI system to perform functions of the example method as described above. It will also be appreciated that the method steps described above could be modified or rearranged, and that additional steps could be added, without changing the scope or spirit of the example embodiment or other sLASER-first-COSY embodiments.

2. Example Operation and Results

In accordance with example embodiments herein, systems and methods implementing sLASER-first-COSY sequences were tested with phantom, pig brain and in vivo human brain experiments.

a. Phantoms, Subjects and Instrumental Setup

The experiments described herein were performed on a Philips Achieva 3 T whole body scanner (Philips Medical Systems, Best, The Netherlands), operating at a proton resonance frequency $f_0$=127.74 MHz. The body coil was used for transmission and a SENSE-Head-8 coil for reception. The maximum RF peak power was 13.5 µT, which is the maximum clinically available $B_1$. Experiments were performed on a GE MRS Braino phantom, fresh pig brain tissue, and human subjects to verify the feasibility of sLASER-first-COSY and also to compare sLASER-first-COSY with sLASER-last-COSY.

The GE MRS Braino phantom (General Electric Medical Systems, Milwaukee, Wis.) contained the following brain metabolites and chemicals: 12.5 mM N-acetyl-aspartate (NAA), 10 mM creatine hydrate (Cr), 3 mM choline chloride (Cho), 7.5 mM myo-inositol (ml), 12.5 mM glutamate (Glu), and 5 mM lactate (Lac) (10, 22).

In vivo studies were conducted on two healthy human volunteers.

b. Experiment Parameters

The sequence parameters for the experiments on GE MRS Braino phantom and pig brain tissue were as follows: voxel size=30×30×30 mm³ for GE MRS Braino phantom and 18×18×18 mm³ for pig brain tissue, number of signal averages (NSA)=8, repetition time (TR)=1600 ms, minimum time from excitation to starting of data acquisition=34 ms and 37 ms for sLASER-first-COSY and sLASER-last-COSY, respectively, 64 $t_1$ steps with an incremental size $\Delta t_1$=0.8 ms, 1024×64 points were acquired with spectral widths of 2000 Hz×1250 Hz in the $F_2 \times F_1$ dimensions, scan duration=13 min and 39 s.

Figure 6:
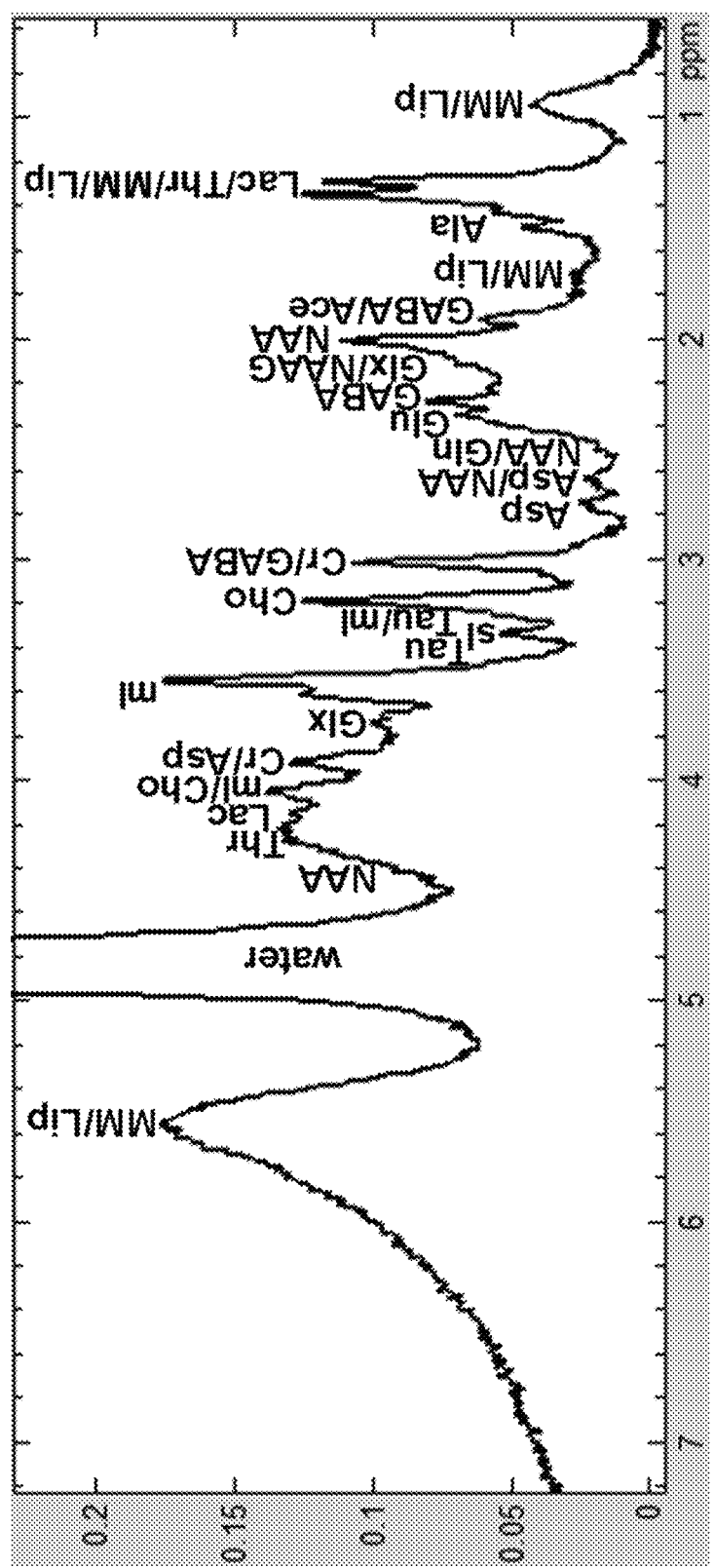
FIG. 6 illustrates a spectrum acquired from fresh pig brain tissue generated by an example routine 1D PRESS pulse sequence.

A routine PRESS experiment on pig brain tissue, shown in FIG. 6, was performed to check the detectable metabolite information with the following parameters: TR/TE=200 ms/26 ms, NSA=128, and total scan time=4 min and 52 s.

For in vivo experiments, a 30×30×30 mm³ voxel was placed aligned with the parieto-occipital junction of the two healthy human volunteers. The durations of all spoiler gradients around the AFP pulses were 1.81 ms and the minimum time from excitation to starting of acquisition were 48 ms and 50 ms in sLASER-first-COSY and sLASER-last-COSY, respectively. The other parameters were the same as those used in the experiments on the GE MRS Braino phantom and pig brain tissue.

c. Spectral Data Processing and Analysis

The 2D MRS data were processed using the Felix software (Accelrys Inc. San Diego, Calif., USA). The datasets were zero-filled from 1024 to 2048 points in $F_2$ and from 64 to 256 points in $F_1$. A solvent suppression with a sinebell window function of 20 Hz was applied. A size of 2048 points and a phase of 40° were applied to $F_2$. A size of 256 points and a phase of 40° were applied to $F_1$. A custom-made Matlab program was used for quantification of peak volumes using the method of intensity integration over peak area.

d. Results

FIGS. 3A-3C and 4A-4C respectively illustrate the sLASER-first-COSY and sLASER-last-COSY spectra acquired from the GE MRS Braino phantom, fresh pig brain tissue and human brain. The spectra in each of FIGS. 3A-3C and 4A-4C are shown with the same scale. The labels "_c" after names of metabolites indicates cross peaks and "_d" indicates diagonal peaks. The following abbreviations are used: Lip=lipid; MM=macromolecule; Glu=glutamate; Glx=glutamate plus glutamine; GABA=γ-aminobutyric acid; NAA=N-acetyl-aspartate; NAAG=N-acetylaspartyl-glutamate; mI=myo-inositol; Ala=alanine; Asp=aspartate; ETA=Ethanolamine; Lac=lactate; His=histidine; Phe=Phenylalanine; PE=phosphorylethanolamine; Tyr=tyrosine; Cho=choline.

Figure 3A:
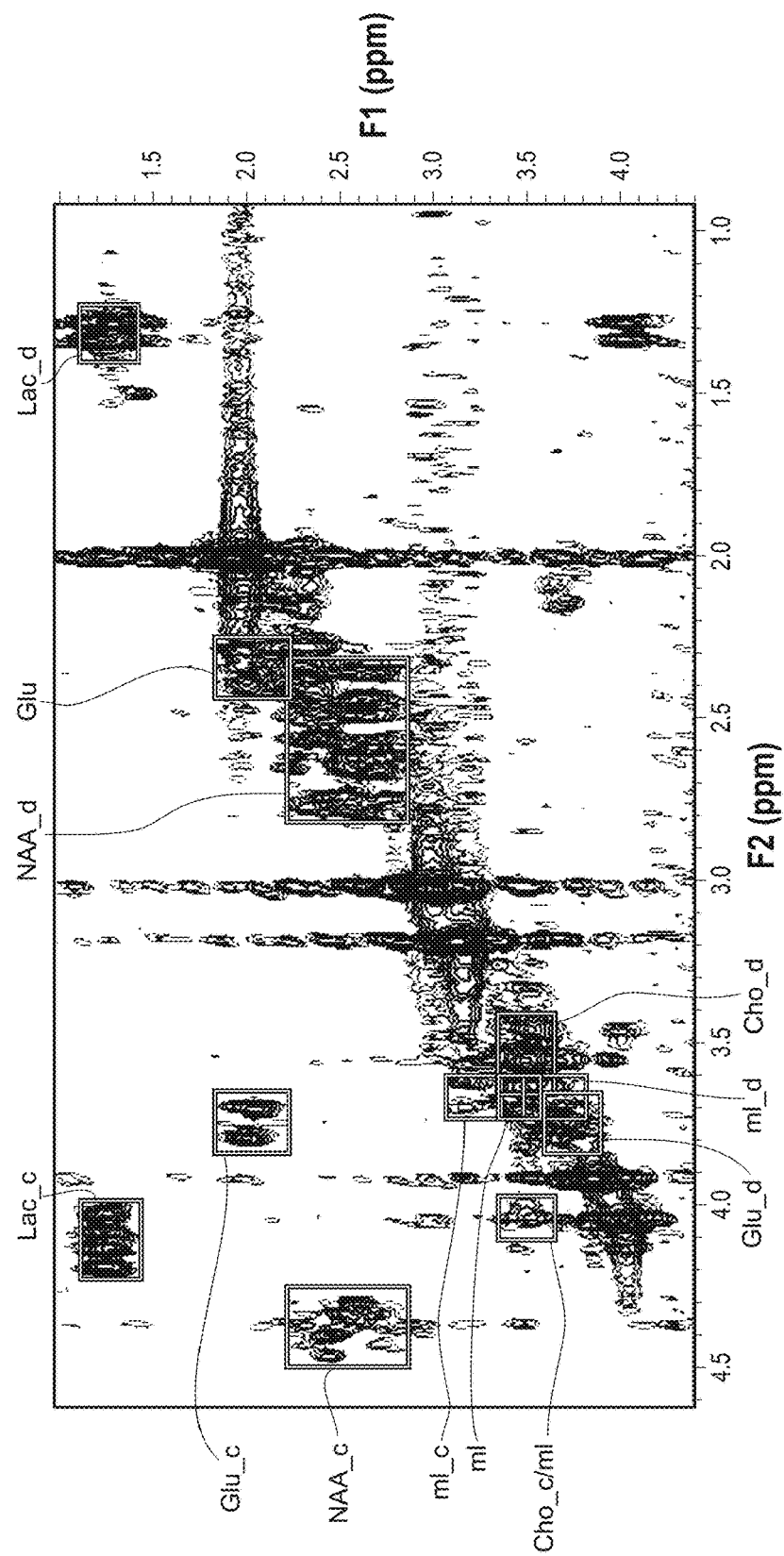
FIGS. 3A, 3B and 3C illustrate spectra acquired from the GE MRS Braino phantom, fresh pig brain tissue and human brain, respectively, generated by one example embodiment of a sLASER-first-COSY pulse sequence.
Figure 4A:
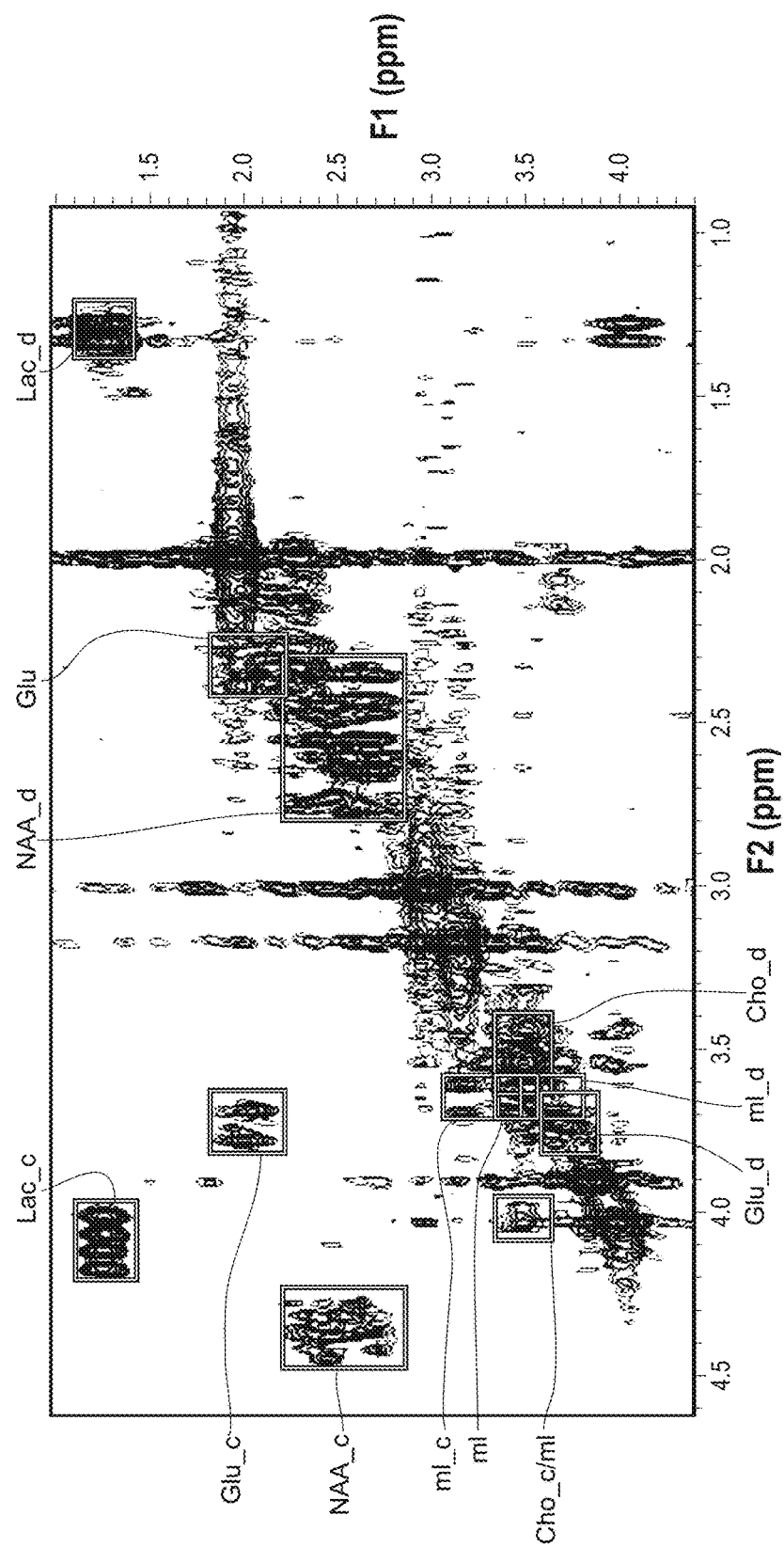
FIGS. 4A, 4B and 4C illustrate spectra acquired from the GE MRS Braino phantom, fresh pig brain tissue and human brain, respectively, generated by one example of a sLASER-last-COSY pulse sequence.

The sLASER-first-COSY and sLASER-last-COSY spectra acquired from the GE MRS Braino phantom are shown in FIG. 3A and FIG. 4A, respectively. Table 1 shows the cross peak volumes and ratios of cross peak volumes to associated diagonal peak volumes in sLASER-first-COSY and sLASER-last-COSY spectra taken from the GE MRS Braino phantom (FIGS. 4A and 5A). All the cross peaks in sLASER-first-COSY are stronger than those in sLASER-last-COSY both in absolute intensity as well as the ratio to diagonal peak. For cross peaks, peak locations are indicated by peak name ($F_2$, $F_1$) with two values in ppm in $F_2$ and $F_1$ axes, respectively; for diagonal peaks, peak locations are indicated by "peak name_d($F_2$)" with only one value in ppm for both $F_2$ and $F_1$ axes (same in all other tables).

TABLE 1

| Cross peak/<br>Diagonal peak | sLASER-first-COSY | | sLASER-last-COSY | |
| --- | --- | --- | --- | --- |
| | cross peak volume | ratio | cross peak volume | ratio |
| Lac(4.10, 1.31)/<br>Lac_d(1.31) | 305 | 0.92 | 196 | 0.66 |
| NAA(4.38, 2.58)/<br>NAA_d(2.58) | 650 | 0.56 | 372 | 0.30 |
| Cho(4.05, 3.50)/<br>Cho_d(3.50) | 360 | 0.56 | 183 | 0.29 |
| Glu(3.74, 2.08)/<br>Glu_d(3.74) | 336 | 0.69 | 199 | 0.45 |
| Glu(2.34, 2.08)/<br>Glu_d(2.34) | 1113 | 1.22 | 1002 | 1.17 |
| mI(3.61, 3.52)/<br>mI_d(3.61) | 1117 | 1.10 | 987 | 1.02 |
| mI(3.61, 3.27)/<br>mI_d(3.61) | 741 | 0.73 | 557 | 0.58 |

Figure 3B:
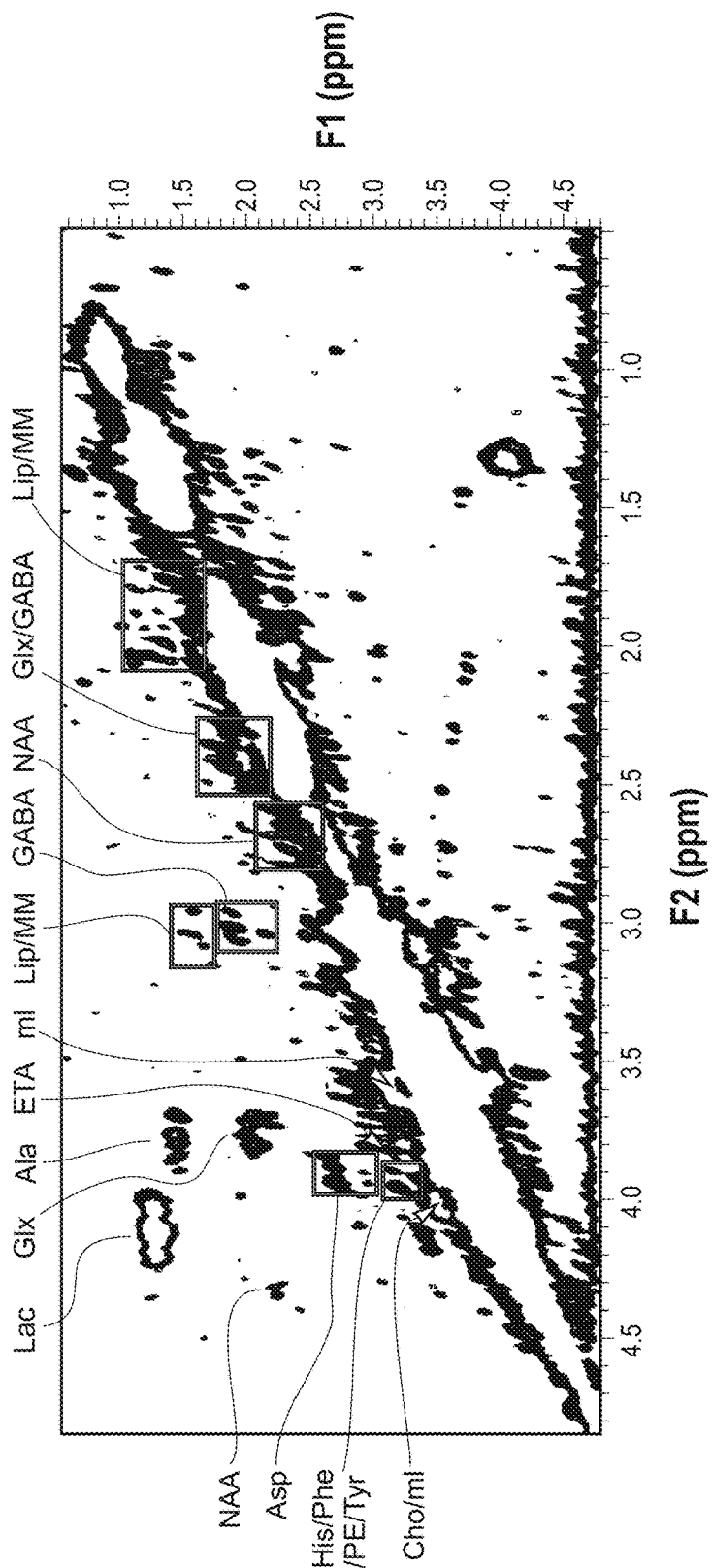

The sLASER-first-COSY and sLASER-last-COSY spectra of fresh pig brain tissue are shown in FIG. 3B and FIG.

Figure 4B:
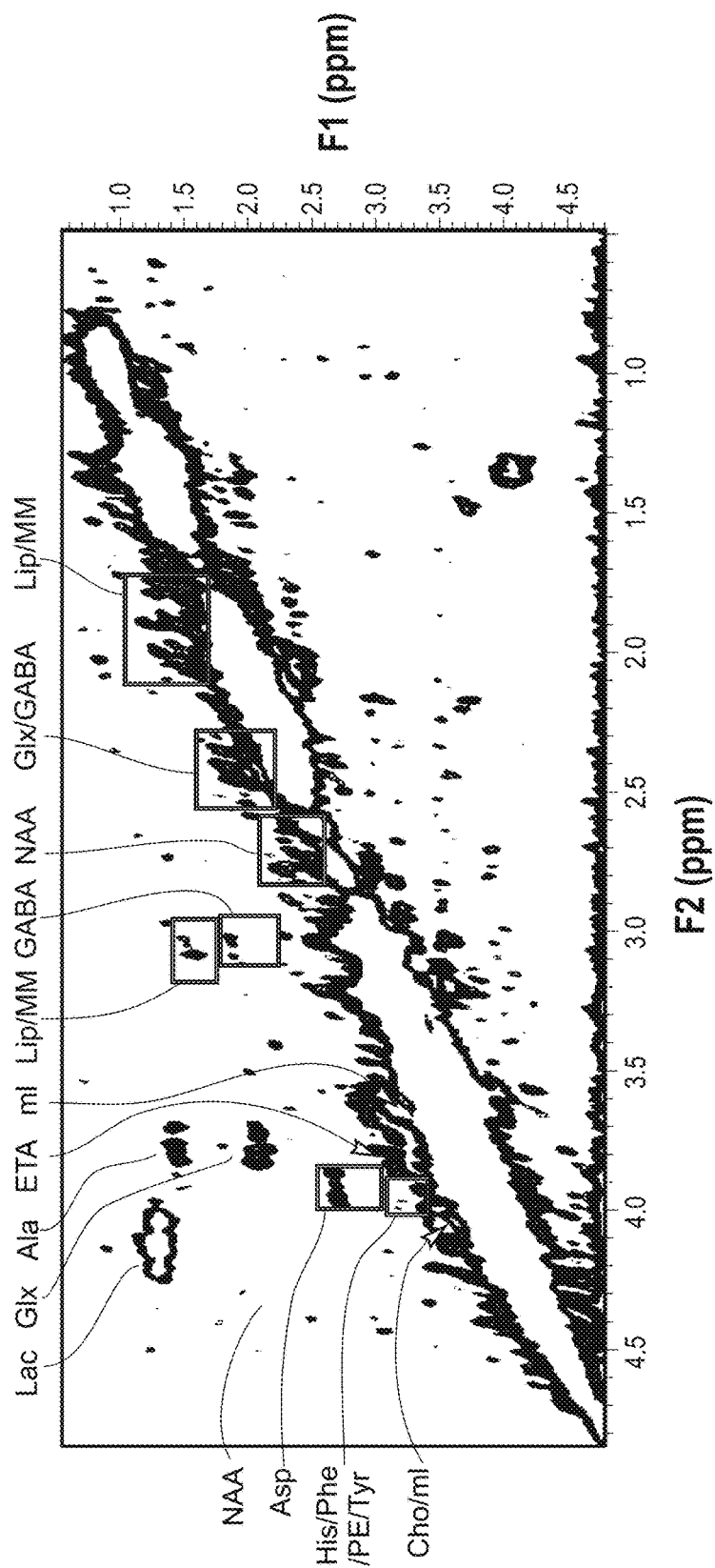

4B, respectively. Table 2 shows the cross peak volumes and ratios of cross peak volumes to associated diagonal peak volumes in sLASER-first-COSY and sLASER-last-COSY spectra of fresh pig brain tissue (FIGS. 4B and 5B). The quantification results show that all the cross peaks in sLASER-first-COSY are stronger than those in sLASER-last-COSY, and all the ratios of the cross peak volumes to the associated diagonal peak volumes are also larger in sLASER-first-COSY.

TABLE 2

| Cross peak/<br>Diagonal peak | sLASER-first-COSY | | sLASER-last-COSY | |
| --- | --- | --- | --- | --- |
| | cross peak<br>volume | ratio | cross peak<br>volume | ratio |
| Lac(4.10, 1.31)/<br>Lac_d(1.31) | 50 | 0.43 | 44 | 0.37 |
| Ala(3.77, 1.47)/<br>Ala_d(1.47) | 25 | 0.44 | 21 | 0.33 |
| Asp(3.89, 2.73)/<br>Asp_d(2.73) | 45 | 0.30 | 30 | 0.20 |
| NAA(4.38, 2.58)/<br>NAA_d(2.58) | 34 | 0.20 | 21 | 0.12 |
| Cho(4.05, 3.50)/<br>Cho_d(3.50) | 39 | 0.19 | 30 | 0.17 |
| Glu(3.74, 2.08)/<br>Glu_d(3.74) | 34 | 0.17 | 26 | 0.15 |
| mI(3.61, 3.27)/<br>mI_d(3.61) | 164 | 0.52 | 134 | 0.50 |
| GABA(3.01, 1.89)/<br>GABA_d(1.89) | 64 | 0.15 | 60 | 0.14 |

Figure 3C:
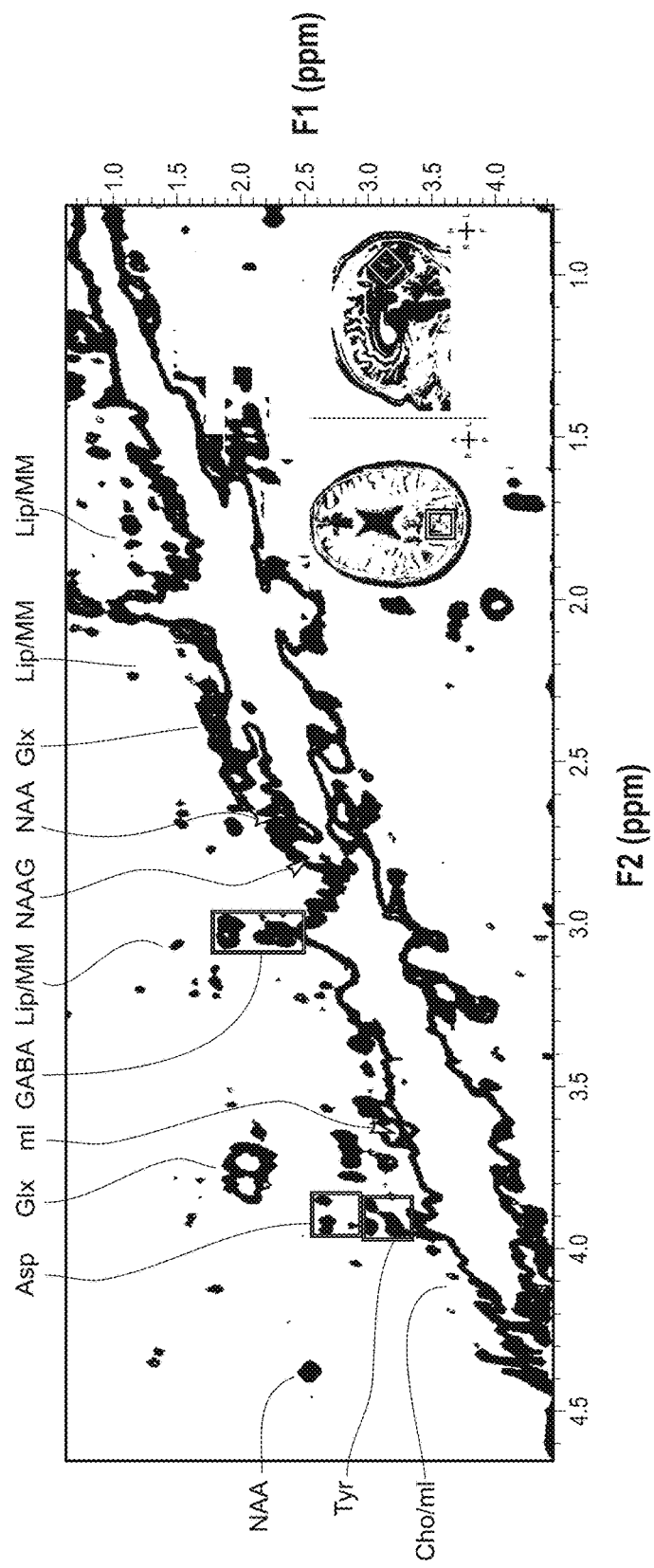
Figure 4C:
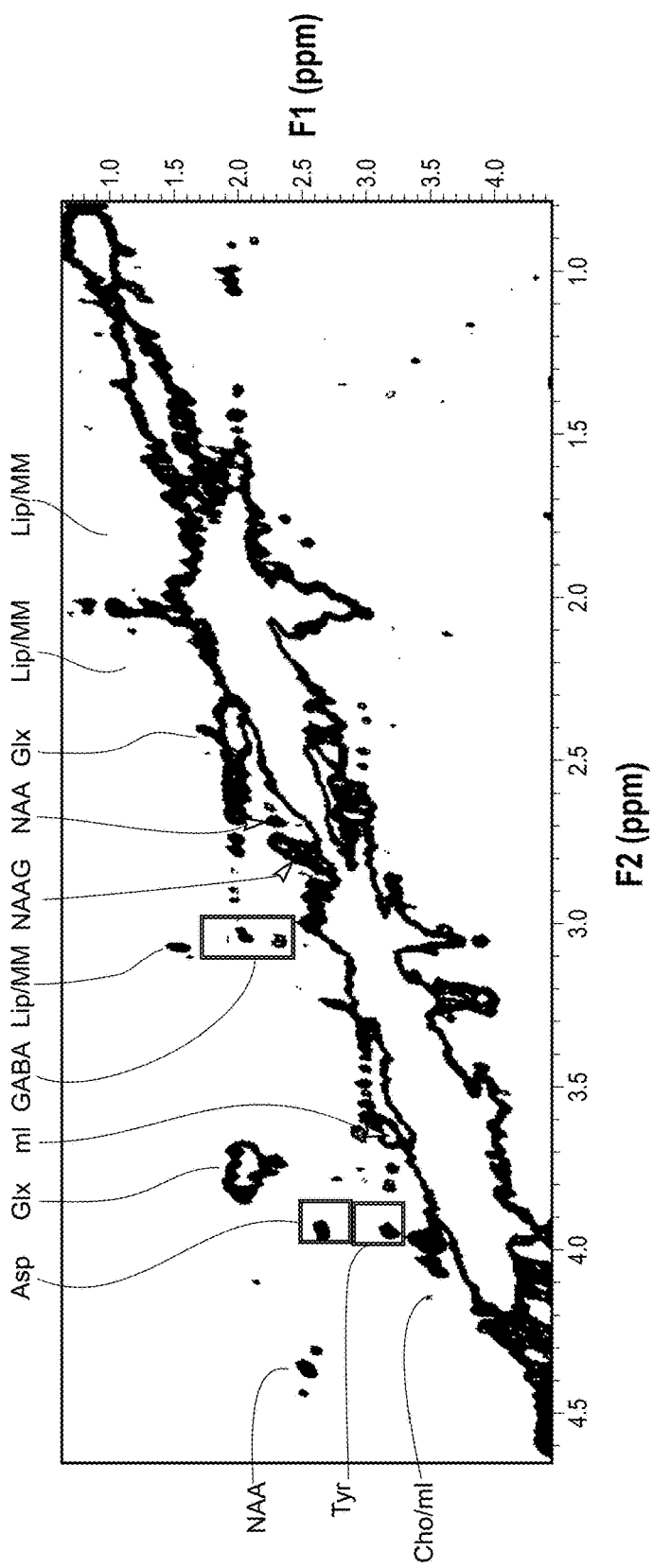
Figure 5C:
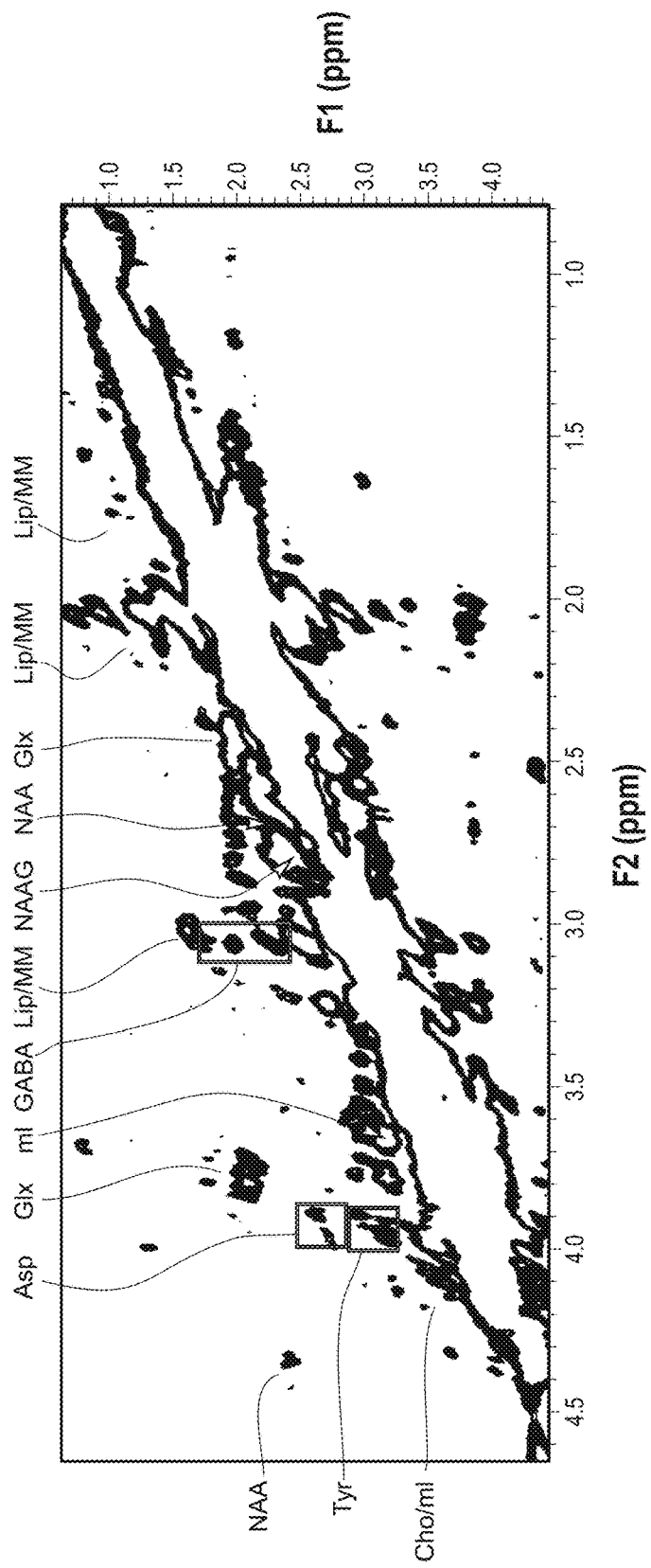

The sLASER-first-COSY and sLASER-last-COSY spectra acquired from a voxel encompassing the parieto-occipital junction of a healthy human volunteer are shown in FIGS. 3C and 4C, respectively. Only the spectra from Subject 1 are shown in these Figures, as the ratios in Subject 1 and 2 were very similar. Table 3 shows ratios of cross peak volumes to associated diagonal peak volumes in sLASER-first-COSY and sLASER-last-COSY spectra from a voxel encompassing parieto-occipital junction of both healthy volunteers (FIGS. 4C and 5C). The quantification results of the spectra from two healthy volunteers are shown in Table 3. Nearly all the cross peak volumes (shown in FIGS. 4C and 5C) and the ratios of the cross peak volumes to associated diagonal peak volumes (shown in Table 3) are larger in sLASER-first-COSY than those in sLASER-last-COSY.

TABLE 3

| | sLASER-first-COSY | | sLASER-last-COSY | |
| --- | --- | --- | --- | --- |
| Ratio | Subject 1 | Subject 2 | Subject 1 | Subject 2 |
| Asp(3.89, 2.73)/<br>Asp_d(2.73) | 0.23 | 0.23 | 0.15 | 0.16 |
| NAA(4.38, 2.58)/<br>NAA_d(2.58) | 0.29 | 0.24 | 0.25 | 0.20 |
| Cho(4.05, 3.50)/<br>Cho_d(3.50) | 0.26 | 0.26 | 0.23 | 0.19 |
| Glu(3.74, 2.08)/<br>Glu_d(3.74) | 0.30 | 0.34 | 0.27 | 0.29 |
| mI(3.61, 3.27)/<br>mI_d(3.61) | 0.44 | 0.42 | 0.43 | 0.46 |
| GABA(3.01, 1.89)/<br>GABA_d(1.89) | 0.10 | 0.11 | 0.10 | 0.09 |

For reference, FIGS. 5A-5C illustrate L-COSY spectra obtained from the GE MRS Braino phantom, fresh pig brain tissue and human brain, respectively. The duration from excitation to the start of data acquisition in sLASER-first-COSY and sLASER-last-COSY were 10 and 13 ms longer than that in L-COSY, respectively. A pair of AFP pulses can provide better pulse profiles than a nonadiabatic regular pulse (8, 14).

FIG. 6 illustrates the routine 1D PRESS spectrum acquired from a voxel of 18×18×18 mm$^3$ in fresh pig brain tissue. There are more metabolites detectable and discernible in the spectra of pig brain tissue than in those of GE MRS Braino phantom, including alanine (Ala), aspartate (Asp), γ-aminobutyric acid (GABA), scyllo-inositol (sI) and lipid (Lip)/macromolecule (MM). The three versions of COSY spectra of the fresh pig brain tissue are shown in FIGS. 3B, 4B and 5B. More metabolite peaks were quantified: Ala ($F_2$=3.77 ppm, $F_1$=1.47 ppm), Asp ($F_2$=189 ppm, $F_1$=2.73 ppm), GABA ($F_2$=3.01 ppm, $F_1$=1.89 ppm) and ($F_2$=2.28 ppm, $F_1$=1.89 ppm). The associated ratios of cross peak volumes to associated diagonal peak volumes in sLASER-first-COSY and sLASER-last-COSY spectra are shown in Table 2. Similar to the quantification results of the GE MRS Braino phantom spectra, the quantification results of the fresh pig brain tissue spectra show that all the cross peak volumes and all the ratios of the cross peak volumes to the associated diagonal peak volumes are larger in sLASER-first-COSY than sLASER-last-COSY.

In conventional L-COSY, if a pair of coupled spins have a large chemical shift difference, one spin may not undergo the second 90° RF pulse in a part of the slice selected for its J-coupled partner, due to a finite BW of the slice-selective second 90° RF pulse. As a result, the magnetization in that specific part of the slice cannot be transferred between coupled spins and the cross peaks cannot be formed. As is described herein, this problem can be solved if the second 90° pulse is not used for slice selection.

The effect of scalar coupling on signal formation in localized COSY, ignoring relaxation and diffusion, among other variables, was investigated. Specifically, a homonuclear J-coupled $I_1 I_2$ spin-1/2 system with a coupling constant J was considered. The L-COSY sequence utilizes three slice-selective RF pulses: 90°-180°-90°. In the part of the plane excited by a slice-selective pulse for spin $I_1$, spin $I_2$ does not experience the pulse due to the chemical shift displacement between spins $I_1$ and $I_2$ (13). The mixing RF pulse is critical in forming cross peaks, so the performance of the second 90° pulse on spin $I_2$ was considered. If the second 90° RF pulse is used for slice selection, the voxel can be decomposed into two distinct subvoxels: subvoxel 1 (spin $I_2$ undergoes the second 90° RF pulse) and subvoxel 2 (spin $I_2$ does not undergo the second 90° pulse). The raising/lowering operators $I^+/I^-$ represent the up/down transitions between energy levels. Assuming an equilibrium condition of spin I is $I_z$, after the first 90° RF pulse with a phase along the direction x, $I_{1z}$ transforms into $(-i/2)I_1^-$ in L-COSY. After the 180° RF pulse in L-COSY, the above spin term evolves as $(-i/2)I_1^+$. During the evolution time $t_1$, the spin term evolves under the chemical shift and J-coupling as $$-\frac{i}{2} I_1^+ \cos(\pi J t_1) e^{-i\Omega_1 t_1} - \frac{1}{2} \cdot 2 I_1^+ I_{2z} \sin(\pi J t_1) e^{-i\Omega_1 t_1}, \quad (1)$$

where the $\Omega_i$ is the frequency offset of spin i (i=1, 2) in the rotating frame. In subvoxel 1, when the second 90° RF pulse is used for slice selection or in the whole voxel when the second 90° RF pulse is not used for slice selection, the second 90° RF pulse is effective on both spins, so the above terms will be converted to $$-\frac{i}{4}I_1^-\cos(\pi J t_1)e^{-i\Omega_1 t_1} - \frac{1}{4}\cdot 2I_{1z}I_2^-\sin(\pi J t_1)e^{-i\Omega_1 t_1}, \quad (2)$$

where the second term is magnetization transfer from spin $I_1$ to spin $I_2$ through J-coupling. Finally, during the evolution time $t_2$, the detectable spin terms evolve under the chemical shift and J-coupling as $$-\frac{i}{4}I_1^-\cos(\pi J t_1)e^{-i\Omega_1 t_1}\cos(\pi J t_2)e^{i\Omega_1 t_2} - \quad (3)$$
$$\frac{i}{4}I_2^-\sin(\pi J t_1)e^{-i\Omega_1 t_1}\sin(\pi J t_2)e^{i\Omega_2 t_2} =$$
$$-\frac{i}{4}I_1^-\cos(\pi J t_1)\cos(\pi J t_2)e^{-i\Omega_1(t_1-t_2)} -$$
$$\frac{i}{4}I_2^-\sin(\pi J t_1)e^{-i\Omega_1 t_1}\sin(\pi J t_2)e^{i\Omega_2 t_2},$$

where the first term forms diagonal peaks and the second term cross peaks. However, when the mixing RF pulse is used for slice selection, the second 90° RF pulse is effective only on spin $I_1$ in subvoxel 2, so the terms in the Eq. (2) will be converted to $$-\frac{i}{4}I_1^-\cos(\pi J t_1)e^{-i\Omega_1 t_1} - \frac{i}{4}\cdot 2I_1^-I_{2z}\sin(\pi J t_1)e^{-i\Omega_1 t_1}, \quad (4)$$

where there is no magnetization transfer in the second term. During the evolution time $t_2$, the detectable spin terms evolve under the chemical shift and J-coupling as $$-\frac{i}{4}I_1^-\cos(\pi J t_1)e^{-i\Omega_1 t_1}\cos(\pi J t_2)e^{i\Omega_1 t_2} - \quad (5)$$
$$\frac{i}{4}I_1^-\sin(\pi J t_1)e^{-i\Omega_1 t_1}\sin(\pi J t_2)e^{i\Omega_1 t_2} =$$
$$-\frac{i}{4}I_1^-\cos[\pi J(t_1-t_2)]e^{-i\Omega_1(t_1-t_2)},$$

which includes only diagonal peaks but no cross peaks. As consequence, the cross peaks in L-COSY will be reduced. The intensity of cross peaks will be reduced by a factor of $$1-\frac{\Delta\delta\cdot f_0}{BW},$$

where $f_0$ is the resonance frequency, $\Delta\delta$ is the chemical shift difference (in ppm) of the spins $I_1$ and $I_2$, BW is the bandwidth (in Hz) of the slice-selective second 90° pulse (11). It can be concluded that the second 90° RF pulse with a limited BW reduces the intensities of cross peaks, which will impair spectral quantification if this factor is not considered. Take lactate as an example, the chemical shift difference $\Delta\delta$ is 2.8 ppm, which will result in 18% loss of cross peaks, if assuming $f_0$=127.74 MHz at 3 Tesla (T) and BW=2000 Hz. The same issue will appear in sLASER-last-COSY as the second 90° RF pulse is used for slice selection as well. However, the peak intensities also depend on pulse profiles, the apparent transverse relaxation time $T_2^*$, and the duration from excitation to starting of data acquisition in the sequence. It was reported that due to better pulse profiles and possibly longer $T_2^*$, improved SNR was observed using adiabatic sequences compared with a nonadiabatic regular sequence (8, 14).

Therefore, if the mixing pulse is not used for slice selection, magnetization will be fully transferred from $I_1$ to $I_2$ and the intensities of cross peaks can be well maintained in sLASER-first-COSY. In theory, for a homonuclear J-coupled $I_1I_2$ spin-1/2 system the cross peak volume should be equal to the diagonal peak volume and the proposed sLASER-first-COSY sequence can completely recover the cross peak. However, imperfect pulse profiles can still contribute to losses in the cross peaks to some extent.

Compared to sLASER-last-COSY, sLASER-first-COSY yielded peaks with higher SNR in the spectra of GE MRS Braino phantom and pig brain tissue (See FIGS. 3A-3B and 4A-4B). Further, compared with the ratios of cross peak volumes to diagonal peak volumes in the spectra of GE MRS Braino phantom in Table 1, the ratios are smaller in the spectra of pig brain tissue and human brain in Tables 2 and 3. This is because there are more peaks from other metabolites overlapping with the diagonal peaks in the spectra of pig brain tissue and human brain than those in the spectra of GE MRS Braino phantom (containing only 6 metabolites, while about 20 metabolites detectable in the pig brain tissue and human brain). Taking Lac as an example, the Lac diagonal peaks overlap with the lipids (Lip)/macromolecules (MM) diagonal peaks at 1.31 ppm in the spectra of pig brain tissue and human brain. In contrast, there are no Lip/MM in the phantom and therefore no Lip/MM diagonal peaks overlapping with the Lac diagonal peaks in the phantom spectra. Because there are no overlap between the Lip/MM cross peaks and the Lac cross peaks at (4.10 ppm, 1.31 ppm) in the L-COSY spectra, the peak ratios of Lac in the spectra of pig brain tissue are smaller than those in the spectra of GE MRS Braino phantom (Lac peak not shown clearly in human brain spectra because of very low concentration in normal brain tissue). Peak volumes estimated by the method of intensity integration over peak area can be biased due to peak overlap. However, the biased values caused by cross peaks overlapping cross peaks or diagonal peaks overlapping with diagonal peaks can still be used to qualitatively compare the performance of the two sLASER COSY sequences. To mitigate the above issues, a 2D fitting of the COSY spectra with the 2D version of "basis functions" or "modal spectra" (23) can be implemented, similar with the LCModel analysis of 1D spectra (24).

The striping artifacts, i.e., ridges of noises running parallel to the $F_1$ and $F_2$ axis (but mainly along the $F_1$ dimension), are described as $t_1$ and $t_2$ noise, respectively (25). The $t_1$ and $t_2$ noises are evident wherever there are strong peaks in the 2D spectrum. The intensities of both artifacts are proportional to the peak amplitude (25). Because at the same concentrations the metabolite resonances are always weaker in ex vivo and in vivo spectra than in phantom spectra due to the $T_2$ relaxation effects, the striping artifacts are more evident in phantom spectra. This is why the $t_1$ noises are clearly presented in the phantom spectra (FIGS. 3A and 4A) but less evident in the spectra of pig brain tissue (FIGS. 3B and 4B) and human brain (FIGS. 3C and 4C).

In summary, the performed experiments demonstrate that, as compared to sLASER-last-COSY, both the cross peak volumes and also the ratios of cross peak volumes to associated diagonal peak volumes were larger in sLASER-first-COSY. This result evidences that cross peaks can be better maintained in sLASER-first-COSY than in sLASER-last-COSY. Although the LASER-COSY sequence (1) can also fully transfer magnetization, LASER-COSY requires significantly longer echo time (TE) (the duration from excitation to the start of data acquisition) and has a higher specific absorption rate (SAR) than semi-LASER-COSY, with a lower overall SNR (2, 20, 21). Accordingly, sLASER-first-COSY may have some advantages over LASER-COSY for in vivo applications.

An exemplary embodiment of the present invention has been described above. Those skilled in the art will understand, however, that changes and modifications may be made to this embodiment without departing from the true scope and spirit of the invention, which is defined by the claims.

REFERENCES

1. Andronesi O C, Ramadan S, Mountford C E, Sorensen A G. Low-power adiabatic sequences for in vivo localized two-dimensional chemical shift correlated MR spectroscopy. Magn Reson Med 2010; 64:1542-1556.
2. Boer V O, van Lier A L H M, Hoogduin J M, Wijnen J P, Luijten P R, Klomp D W J. 7-T $^1$H MRS with adiabatic refocusing at short T E using radiofrequency focusing with a dual-channel volume transmit coil. NMR Biomed 2011; 24:1038-1046.
3. Kinchesh P, Ordidge R J. Spin-echo MRS in humans at high field: LASER localisation using FOCI pulses. J Magn Reson B 2005; 175:30-43.
4. Mason G F, Pohost G M, Hetherington H P. Numerically Optimized Experiment Design for Measurement of Grey/White Matter Metabolite $T_2$ in High-Resolution Spectroscopic Images of Brain. J Magn Reson B 1995; 107:68-73.
5. Posse S, Cuenod C A, Risinger R, Lebihan D, Balaban R S. Anomalous transverse relaxation in $^1$H spectroscopy in human brain at 4 Tesla. Magn Reson Med 1995; 33:246-252.
6. Michaeli S, Garwood M, Zhu X H, DelaBarre L, Andersen P, Adriany G, Merkle H, Ugurbil K, Chen W. Proton $T_2$ relaxation study of water, N-acetylaspartate, and creatine in human brain using Hahn and Carr-Purcell spin echoes at 4 T and 7 T. Magn Reson Med 2002; 47:629-633.
7. Andronesi O C, Ramadan S, Ratai E M, Jennings D, Mountford C E, Sorensen A G. Spectroscopic imaging with improved gradient modulated constant adiabaticity pulses on high-field clinical scanners. J Magn Reson 2010; 203:283-293.
8. Ramadan S, Mountford C E. Adiabatic localized correlation spectroscopy (AL-COSY): application in muscle and brain. J Magn Reson Imaging 2011; 33:1447-1455.
9. de Graaf R A. In vivo NMR spectroscopy—Principles and techniques. Chichester, U K: John Wiley; 1998.
10. Thomas M A, Yue K, Binesh N, Davanzo P, Kumar A, Siegel B, Frye M, Curran J, Lufkin R, Martin P, Guze B. Localized two-dimensional shift correlated M R spectroscopy of human brain. Magn Reson Med 2001; 46:58-67.
11. Edden R A E, Barker P B. If J doesn't evolve, it won't J-resolve: J-PRESS with bandwidth-limited refocusing pulses. Magn Reson Med 2011; 65:1509-1514.
12. Thompson R B, Allen P S. Sources of variability in the response of coupled spins to the PRESS sequence and their potential impact on metabolite quantification. Magn Reson Med 1999; 41:1162-1169.
13. Yablonskiy D A, Neil J J, Raichle M E, Ackerman J J H. Homonuclear J coupling effects in volume localized NMR spectroscopy: Pitfalls and solutions. Magn Reson Med 1998; 39:169-178.
14. Lin M J, Kumar A, Yang S L. Two-dimensional J-resolved LASER and semi-LASER spectroscopy of human brain. Magn Reson Med 2013; doi: 10.1002/mrm.24732.
15. de Graaf R A, Luo Y, Terpstra M, Merkle H, Garwood M. A new localization method using an adiabatic pulse, BIR-4. J Magn Reson B 1995; 106:245-252.
16. Garwood M, DelaBarre L. The return of the frequency sweep: Designing adiabatic pulses for contemporary NMR. J Magn Reson 2001; 153:155-177.
17. Sacolick L I, Rothman D L, de Graaf R A. Adiabatic refocusing pulses for volume selection in magnetic resonance spectroscopic imaging. Magn Reson Med 2007; 57:548-553.
18. Tannus A, Garwood M. Adiabatic pulses. NMR Biomed 1997; 10:423-434.
19. Andronesi O C, Kim G S, Gerstner E, Batchelor T, Tzika A A, Fantin V R, Vander Heiden M G, Sorensen A G. Detection of 2-hydroxyglutarate in IDH-mutated glioma patients by in vivo spectral-editing and 2D correlation magnetic resonance spectroscopy. Sci Transl Med 2012; 4:116ra4.
20. Scheenen T W J, Heerschap A, Klomp D W J. Towards $^1$H-MRSI of the human brain at 7 T with slice-selective adiabatic refocusing pulses. Magn Reson Mat Phys Biol Med 2008; 21:95-101.
21. Scheenen T W J, Klomp D W J, Wijnen J P, Heerschap A. Short echo time $^1$H-MRSI of the human brain at 3 T with minimal chemical shift displacement errors using adiabatic refocusing pulses. Magn Reson Med 2008; 59:1-6.
22. Schirmer T, Auer D P. On the reliability of quantitative clinical magnetic resonance spectroscopy of the human brain. NMR Biomed 2000; 13:28-36.
23. Schulte R F, Boesiger P. ProFit: two-dimensional prior-knowledge fitting of J-resolved spectra. NMR Biomed 2006; 19(2):255-263.
24. Provencher S W. Estimation of metabolite concentrations from localized in-vivo proton NMR-spectra. Magn Reson Med 1993; 30:672-679.
25. Mehlkopf A F, Korbee D, Tiggelman T A, Freeman R. Sources of $t_1$ noise in two-dimensional NMR. J Magn Reson 1984; 58:315-323.
26. Govindaraju V, Young K, Maudsley A. Proton NMR chemical shifts and coupling constants for brain metabolites. NMR Biomed 2000; 13:129-153.
27. de Graaf R A, Rothman D L. In vivo detection and quantification of scalar coupled 1H NMR resonances. Concepts Magn Resort 2001; 13:32-76.
28. Ernst R R. 2-dimensional spectroscopy. Chirnia 1975; 29:179-183.
29. Ryner L N, Sorenson J A, Thomas M A. 3D localized 2D NMR spectroscopy on an M R scanner. J Magn Reson B 995; 107:126-137.
30. Thomas M A, Binesh N, Vitt, K, DeBruld. N. Volume-localized two-dimensional correlated magnetic resonance spectroscopy of human breast cancer. J Magn Reson Imaging 2001; 14:181-186.
31. Thomas M A, Hattori N, Umeda M, Sawada T, Naruse S. Evaluation of two-dimensional L-COSY and PRESS using a 3 T MRI scanner: from phantoms to human brain in vivo. NMR Biomed 2003; 16:245-251.
32. Ryner L N, Sorenson J A, Thomas M A. Localized 2D J-resolved 1H Mr spectroscopy: strongcoupling effects in-vitro and in-vivo. J Magn Reson Imaging 1995; 13:853-869.

33. Norris D G. Adiabatic radiofrequency pulse forms in biomedical nuclear magnetic resonance. Concepts Magn Reson 2002; 14:89-101.
34. de Graaf R A, Luo Y, Garwood M, Nicolay K. B-1-insensitive, single-shot localization and water suppression. J Magn Resort B 1996; 113:35-45.
35. de Graaf R A, Luo Y, Terpstra M, Garwood M. Spectral editing with adiabatic pulses. J Magri Resort B 1995; 109:184-193.
36. Balchandani P, Pauly J, Spielman D. Slice-selective tunable-flip adiabatic low peak-power excitation pulse. Magri Reson Med 2008; 59:1072-1078.
37. Moore J, Jankiewicz M, Anderson A W, Gore J C. Evaluation of non-selective refocusing pulses for 7 T MRI. J Magn Reson 2012; 214:212-220.
38. de Graaf R A, Nicolay K. Adiabatic water suppression using frequency selective excitation. Magn Reson Med 1998; 40:690-696.

What is claimed is:

1. In a magnetic resonance imaging (MM) scanner system, a computer-implemented method comprising:
   generating a first 90° radio frequency (RF) pulse configured to be transmitted to an object to modify an output signal, wherein the first 90° RF pulse is a non-adiabatic slice-selective 90° RF pulse configured to effect selection of an orthogonal plane;
   after a delay time, $\Delta_1$, from generation of the first 90° RF pulse, generating a first pair of adiabatic full-passage (AFP) pulses, wherein the first pair of AFP pulses is separated by an inter-pulse time interval, $\Delta_2$;
   generating a second pair of AFP pulses, wherein the second pair of AFP pulses is separated by the time $\Delta_2$;
   after generation of the second pair of AFP pulses, generating a second 90° RF pulse, wherein the second 90° RF pulse is a non-adiabatic non-slice-selective 90° RF pulse configured to fully mix spin states and transfer magnetization between coupled spins; and
   acquiring magnetic resonance (MR) signal after an echo time (TE) from generation of the first 90° RF pulse.

2. The method of claim 1, wherein the second pair of AFP pulses is generated after a time $2\Delta_2$ from application of the first pair of AFP pulses.

3. The method of claim 1, wherein the second 90° RF pulse is generated after a time $t_1+2\Delta_2$ from application of the second pair of AFP pulses, wherein $t_1$ is the length of the evolution period.

4. The method of claim 1, further comprising acquiring a sequence of integer N MR signal series, each signal acquired for a sequence of N TE periods, wherein $t_1$ is increased by $\Delta t_1$ for each of the TE periods.

5. The method of claim 1, wherein each AFP pulse is slice-selective.

6. The method of claim 1, wherein transmission of the first and second pairs of AFP pulses causes suppression of one or more of chemical shift displacement errors and sensitivity to RF field inhomogeneity.

7. The method of claim 1, wherein transmission of the second 90° RF pulse achieves magnetization transfer between a coupled spin pair of a metabolite in the object.

8. The method of claim 1, wherein transmission of the second 90° RF pulse maintains metabolite cross peak intensity of a coupled spin pair of a metabolite in the object.

9. The method of claim 1, further comprising:
   simultaneously applying to the object a pair of magnetic field spoiler gradients ($G_x$) along a first direction, a pair of magnetic field spoiler gradients ($G_y$) along a second direction, and a pair of magnetic field spoiler gradients ($G_z$) along a third direction, around each AFP pulse.

10. The method of claim 9, wherein a first of the pair of magnetic field spoiler gradients ($G_x$) along a first direction, a first of the pair of magnetic field spoiler gradients ($G_y$) along a second direction, and a first of the pair of magnetic field spoiler gradients ($G_z$) along a third direction are each applied after the delay time, $\Delta_1$, from generation of the excitation RF pulse.

11. The method of claim 9, wherein the pairs of magnetic field spoiler gradients around each AFP pulse along the first direction ($G_x$), second direction ($G_y$) and third direction ($G_z$) each have a time interval of $\Delta_2$.

12. The method of claim 1, further comprising:
   simultaneously applying to the object a pair of magnetic field spoiler gradients ($G_x$) along a first direction, a pair of magnetic field spoiler gradients ($G_y$) along a second direction, and a pair of magnetic field spoiler gradients ($G_z$) along a third direction, around the second 90° RF pulse, wherein each pair of gradients around the second 90° RF pulse has a time interval of $\Delta_3$.

13. The method of claim 12, wherein the length of TE corresponds to the time from application of the excitation RF pulse to $\Delta_3/2$ from application of the second 90° RF pulse.

14. An imaging (MM) scanner system comprising:
   one or more processors configured to receive an output signal from a scanner of the system;
   at least one of the one or more processors operably connectable to the MM scanner system and configured to selectively generate a first 90° slice-selective radiofrequency (RF) pulse to modify the output signal, wherein the first 90° RF pulse is a non-adiabatic pulse configured to provide localization for the output signal;
   after a delay time, $\Delta_1$, from generating the first 90° RF pulse, generating a first pair of adiabatic full-passage (AFP) pulses to modify the output signal, wherein the first pair of AFP pulses are separated by an inter-pulse time interval, $\Delta_2$;
   generating a second pair of AFP pulses, wherein the second pair of AFP pulses are separated by the time $\Delta_2$; and
   generating a second 90° RF pulse, wherein the second 90° RF pulse is a non-adiabatic non-slice-selective 90° RF pulse configured to fully mix spin states and transfer magnetization between coupled spins.

15. The system of claim 14, wherein the functions further comprise:
   applying to an object in the MRI scanner system, a main magnetic field having a magnitude of 3 T or greater.

16. The system of claim 14, wherein the second pair of AFP pulses is applied to the object after a time $2\Delta_2$ from application of the first pair of AFP pulses.

17. The system of claim 14, wherein the second 90° RF pulse is applied to the object after a time $t_1+2\Delta_2$ from application of the second pair of AFP pulses.

18. A nontransitory computer-readable medium having instructions stored thereon that, upon execution by one or more processors of a magnetic resonance imaging (MRI) scanner system, cause the MM scanner system to carry out functions comprising:
   applying to an object in the MRI scanner system a first 90° radiofrequency (RF) pulse, wherein the first 90° RF pulse is a non-adiabatic slice-selective 90° RF pulse configured to effect selection of an orthogonal plane;

after a delay time, $\Delta_1$, from application of the first 90° RF pulse, applying to the object, a first pair of adiabatic full-passage (AFP) pulses, wherein the first pair of AFP pulses are separated by an inter-pulse time interval, $\Delta_2$;

applying to the object, a second pair of AFP pulses, wherein the second pair of AFP pulses are separated by the time $\Delta_2$;

applying to the object a second 90° RF pulse, wherein the second 90° RF pulse is a non-adiabatic non-slice-selective 90° RF pulse configured to fully mix spin states and transfer magnetization between coupled spins; and acquiring magnetic resonance (MR) signal after an echo time (TE) from application of the excitation RF pulse.

19. The nontransitory computer-readable medium of claim 18, wherein the functions further comprise:

applying a main magnetic field having a magnitude of 3 T or greater.

* * * * *